(12) United States Patent
Li et al.

(10) Patent No.: US 12,520,664 B2
(45) Date of Patent: Jan. 6, 2026

(54) DISPLAY SUBSTRATE AND DISPLAY DEVICE HAVING LIGHT-TRANSMITTING OPENINGS AND LIGHT-TRANSMITTING PORTIONS

(71) Applicants: Chengdu BOE Optoelectronics Technology Co., Ltd., Chengdu (CN); BOE TECHNOLOGY GROUP CO., LTD., Beijing (CN)

(72) Inventors: Shuo Li, Beijing (CN); Dan Guo, Beijing (CN); Yao Hu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 735 days.

(21) Appl. No.: 17/796,490

(22) PCT Filed: Nov. 4, 2021

(86) PCT No.: PCT/CN2021/128699
§ 371 (c)(1),
(2) Date: Jul. 29, 2022

(87) PCT Pub. No.: WO2022/160840
PCT Pub. Date: Aug. 4, 2022

(65) Prior Publication Data
US 2023/0354680 A1    Nov. 2, 2023

(30) Foreign Application Priority Data

Jan. 26, 2021  (WO) ................ PCT/CN2021/073725
May 19, 2021  (WO) ................ PCT/CN2021/094676
Jun. 29, 2021  (CN) .......................... 202110726490.3

(51) Int. Cl.
*H10K 59/121*       (2023.01)
*H10K 50/86*        (2023.01)
(Continued)

(52) U.S. Cl.
CPC ......... *H10K 59/121* (2023.02); *H10K 59/122* (2023.02); *H10K 59/131* (2023.02);
(Continued)

(58) Field of Classification Search
CPC ............... H10K 59/121; H10K 59/131; H10K 59/80521; H10K 59/122; H10K 59/35;
(Continued)

(56) References Cited

U.S. PATENT DOCUMENTS

2011/0102308 A1    5/2011   Nakamura et al.
2011/0285680 A1   11/2011   Nakamura
(Continued)

FOREIGN PATENT DOCUMENTS

CN    101266759 A    9/2008
CN    102280074 A   12/2011
(Continued)

OTHER PUBLICATIONS

U.S. Office Action in U.S. Appl. No. 17/789,674 dated Jul. 30, 2024.
(Continued)

*Primary Examiner* — Eric W Jones
(74) *Attorney, Agent, or Firm* — Collard & Roe, P.C.

(57) ABSTRACT

A display substrate and a display device are disclosed, the display substrate has a plurality of sub-pixels arranged in an array, and includes a base substrate, a driving circuit layer, a light-emitting device layer, and a black matrix layer. Each sub-pixel includes a pixel driving circuit in the driving circuit layer and a light-emitting device in the light-emitting device layer, and the black matrix layer includes a plurality of first light-transmitting openings respectively exposing
(Continued)

light-emitting devices (EM) of the plurality of sub-pixels, and includes a plurality of second light-transmitting openings respectively between the plurality of first light-transmitting openings. The driving circuit layer includes a plurality of light-transmitting portions, and each of the plurality of second light-transmitting openings is provided corresponding to at least one of the plurality of light-transmitting portions for transmitting light in a predetermined angle range with the surface of the display substrate.

18 Claims, 17 Drawing Sheets

(51) Int. Cl.
*H10K 59/122* (2023.01)
*H10K 59/131* (2023.01)
*H10K 59/35* (2023.01)
*H10K 59/65* (2023.01)
*H10K 59/80* (2023.01)

(52) U.S. Cl.
CPC ....... *H10K 59/35* (2023.02); *H10K 59/80521* (2023.02); *H10K 59/8792* (2023.02); *H10K 50/865* (2023.02); *H10K 59/65* (2023.02)

(58) Field of Classification Search
CPC ... H10K 59/8792; H10K 59/65; H10K 50/865
USPC .............................................. 257/40, 59, 89
See application file for complete search history.

(56) References Cited

U.S. PATENT DOCUMENTS

| | | | |
|---|---|---|---|
| 2012/0182277 A1 | 7/2012 | Jeong et al. | |
| 2013/0002690 A1 | 1/2013 | Ichinose et al. | |
| 2013/0076723 A1 | 3/2013 | Niioka et al. | |
| 2013/0082909 A1 | 4/2013 | Miura et al. | |
| 2013/0293459 A1* | 11/2013 | Nakamura | H10K 59/12 345/156 |
| 2014/0176893 A1 | 6/2014 | Sugitani et al. | |
| 2015/0109697 A1* | 4/2015 | Nagase | G02B 5/201 359/891 |
| 2015/0160754 A1 | 6/2015 | Wenzel | |
| 2016/0071910 A1 | 3/2016 | Sasaki et al. | |
| 2016/0195983 A1 | 7/2016 | Miyake | |
| 2016/0276421 A1 | 9/2016 | Lee et al. | |
| 2017/0162632 A1* | 6/2017 | Kim | H10K 59/351 |
| 2017/0213878 A1 | 7/2017 | Song et al. | |
| 2017/0221196 A1 | 8/2017 | Yamaguchi et al. | |
| 2017/0277219 A1 | 9/2017 | Chung et al. | |
| 2018/0095567 A1 | 4/2018 | Lee et al. | |
| 2018/0348554 A1 | 12/2018 | Zhou | |
| 2019/0064960 A1 | 2/2019 | Na et al. | |
| 2019/0140030 A1 | 5/2019 | Huangfu et al. | |
| 2019/0213379 A1 | 7/2019 | Zhao et al. | |
| 2019/0245017 A1 | 8/2019 | Jeon et al. | |
| 2019/0258338 A1 | 8/2019 | Park | |
| 2019/0303641 A1 | 10/2019 | Ko et al. | |
| 2019/0326360 A1* | 10/2019 | Gwon | G06F 3/044 |
| 2019/0326361 A1* | 10/2019 | Gwon | H10K 77/111 |
| 2020/0013833 A1* | 1/2020 | Wang | H10K 59/351 |
| 2020/0034600 A1 | 1/2020 | Chan et al. | |
| 2020/0117304 A1 | 4/2020 | Lee et al. | |
| 2020/0161398 A1* | 5/2020 | Bang | H10K 59/124 |
| 2020/0203453 A1 | 6/2020 | Kim et al. | |
| 2020/0343477 A1 | 10/2020 | Zeng et al. | |
| 2020/0363905 A1 | 11/2020 | Jo et al. | |
| 2021/0013268 A1 | 1/2021 | Joo et al. | |
| 2021/0149525 A1 | 5/2021 | Xu et al. | |
| 2021/0232841 A1 | 7/2021 | Wang et al. | |
| 2021/0320130 A1 | 10/2021 | Xian et al. | |
| 2021/0326001 A1 | 10/2021 | Jo et al. | |
| 2021/0328199 A1 | 10/2021 | Yao et al. | |
| 2021/0343951 A1* | 11/2021 | Ju | H10K 77/10 |
| 2021/0376003 A1 | 12/2021 | Ku et al. | |
| 2021/0397806 A1 | 12/2021 | Lu et al. | |
| 2022/0011482 A1 | 1/2022 | Wang et al. | |
| 2022/0052139 A1 | 2/2022 | Xu | |
| 2022/0129131 A1 | 4/2022 | Liu et al. | |
| 2022/0137751 A1 | 5/2022 | Wang et al. | |
| 2022/0199942 A1 | 6/2022 | Li et al. | |
| 2022/0246893 A1 | 8/2022 | Hatsumi et al. | |
| 2022/0334678 A1 | 10/2022 | Long | |
| 2022/0376215 A1 | 11/2022 | Gao et al. | |
| 2022/0392971 A1 | 12/2022 | Wang et al. | |
| 2023/0214040 A1 | 7/2023 | Kim et al. | |
| 2023/0363207 A1 | 11/2023 | Li et al. | |

FOREIGN PATENT DOCUMENTS

| | | |
|---|---|---|
| CN | 102722030 A | 10/2012 |
| CN | 205281463 U | 6/2016 |
| CN | 206209239 A | 5/2017 |
| CN | 107065360 A | 8/2017 |
| CN | 107111392 A | 8/2017 |
| CN | 108288681 A | 7/2018 |
| CN | 109144311 A | 1/2019 |
| CN | 110061042 A | 7/2019 |
| CN | 110137206 A | 8/2019 |
| CN | 110416272 A | 11/2019 |
| CN | 110534551 A | 12/2019 |
| CN | 110728267 A | 1/2020 |
| CN | 111106153 A | 5/2020 |
| CN | 111129105 A | 5/2020 |
| CN | 111162110 A | 5/2020 |
| CN | 111312792 A | 6/2020 |
| CN | 111564571 A | 8/2020 |
| CN | 111584599 A | 8/2020 |
| CN | 111599846 A | 8/2020 |
| CN | 111668388 A | 9/2020 |
| CN | 111694189 A | 9/2020 |
| CN | 111725264 A | 9/2020 |
| CN | 111831172 A | 10/2020 |
| CN | 112103328 A | 12/2020 |
| CN | 112186022 A | 1/2021 |
| CN | 112259584 A | 1/2021 |
| CN | 112313802 A | 2/2021 |
| CN | 112363636 A | 2/2021 |
| CN | 112420955 A | 2/2021 |
| CN | 112420956 A | 2/2021 |
| CN | 112786813 A | 2/2021 |
| CN | 112531006 A | 3/2021 |
| CN | 112534583 A | 3/2021 |
| CN | 112654917 A | 4/2021 |
| CN | 112673477 A | 4/2021 |
| CN | 112786812 A | 5/2021 |
| CN | 215834530 U | 2/2022 |
| EP | 2 348 388 A2 | 7/2011 |
| EP | 3 089 149 A1 | 11/2016 |
| IN | 215578574 U | 1/2022 |
| JP | 2011118330 A | 6/2011 |
| JP | 2011151652 A | 8/2011 |
| JP | 2016081257 A | 5/2016 |
| JP | 2017146812 A | 8/2017 |
| JP | 2019129221 A | 8/2019 |
| JP | 2020194158 A | 12/2020 |
| KR | 10-2019-0037391 A | 4/2019 |
| WO | 2013191082 A1 | 12/2013 |
| WO | 2016080046 A1 | 5/2016 |
| WO | 2019155318 A1 | 5/2019 |
| WO | 2019218659 A1 | 11/2019 |
| WO | 2020220302 A1 | 11/2020 |
| WO | 2020259647 A1 | 12/2020 |
| WO | 2021009638 A1 | 1/2021 |
| WO | 2021102791 A1 | 6/2021 |

OTHER PUBLICATIONS

Extended European Search Report in European Application No. 21940136.1 dated Nov. 30, 2023.

(56) References Cited

OTHER PUBLICATIONS

European Office Action in European Application No. 21926068.4 dated Jan. 16, 2024.
International Search Report of PCT/CN2021/128699 dated Dec. 23, 2021 in English.
Written Opinion in PCT/CN2021/128699 dated Dec. 23, 2021 in Chinese.
Chinese Office Action in Chinese Application No. 202110726472.5 dated Dec. 20, 2024 with English translation.
U.S. Office Action in U.S. Appl. No. 17/800,045 dated Feb. 3, 2025.
Chinese Office Action in Chinese Application No. 202180016551.5 dated Jan. 30, 2023 with English translation.
Extended European Search Report in European Application No. 21922429.2 dated Aug. 4, 2023.
Extended European Search Report in European Application No. 21922430.0 dated Aug. 7, 2023.
Extended European Search Report in European Application No. 21926068.4 dated Aug. 10, 2023.
Japanese Office Action in Japanese Application No. 2023-525090 dated Apr. 1, 2025 with English translation.
U.S. Office Action in U.S. Appl. No. 17/789,674 dated Jul. 1, 2025.
U.S. Office Action in U.S. Appl. No. 17/979,227 dated Jul. 11, 2025.
Korean Office Action in Korean Application No. 10-2023-7000767 dated Jun. 20, 2025 with English translation.
Chinese Office Action in Chinese Application No. 2021107264725 dated Jun. 30, 2025 with English translation.
Japanese Office Action in Japanese Application No. 2022-558517 dated Jul. 29, 2025 with English translation.
Japanese Office Action in Japanese Application No. 2022-558522 dated Jul. 29, 2025 with English translation.

\* cited by examiner

DISPLAY SUBSTRATE AND DISPLAY DEVICE HAVING LIGHT-TRANSMITTING OPENINGS AND LIGHT-TRANSMITTING PORTIONS

CROSS REFERENCE TO RELATED APPLICATIONS

This application is the National Stage of PCT/CN2021/128699 filed on Nov. 4, 2021, which claims the priority to International Patent Application No. PCT/CN2021/073725, filed on Jan. 26, 2021, International Patent Application No. PCT/CN2021/094676, filed on May 19, 2021, and claims priority under 35 U.S.C. § 119 to Chinese Patent Application No. 202110726490.3, filed on Jun. 29, 2021, the entire disclosure of which is incorporated herein by reference as part of the present application.

TECHNICAL FIELD

Embodiments of the present disclosure relate to a display substrate and a display device.

BACKGROUND

OLED (Organic Light Emitting Diode) display device has a series of advantages such as self-luminescence, high contrast, high definition, wide viewing angle, low power consumption, fast response speed, and low manufacturing cost, and has become one of the key development directions of the new generation of display devices, so the OLED display device has received more and more attention.

SUMMARY

At least one embodiment of the present disclosure provides a display substrate, the display substrate has a plurality of sub-pixels arranged in an array, and comprises a base substrate, a driving circuit layer on the base substrate, a light-emitting device layer on a side of the driving circuit layer away from the base substrate, and a black matrix layer on a side of the light-emitting device layer away from the base substrate, each of the plurality of sub-pixels comprises a pixel driving circuit in the driving circuit layer and a light-emitting device in the light-emitting device layer, the pixel driving circuit is configured to drive the light-emitting device, the black matrix layer comprises a plurality of first light-transmitting openings respectively exposing light-emitting devices of the plurality of sub-pixels in a direction perpendicular to a surface of the base substrate, and a plurality of second light-transmitting openings respectively between the plurality of first light-transmitting openings; and the driving circuit layer comprises a plurality of light-transmitting portions, and each of the plurality of second light-transmitting openings is provided corresponding to at least one of the plurality of light-transmitting portions for transmitting light in a predetermined angle range with the surface of the display substrate.

For example, in the display substrate provided by at least one embodiment of the present disclosure, the plurality of sub-pixels comprise a first sub-pixel and a second sub-pixel, and the plurality of light-transmitting portions comprise a first light-transmitting portion comprised in a pixel driving circuit of the first sub-pixel and a second light-transmitting portion comprised in a pixel driving circuit of the second sub-pixel; in the direction perpendicular to the surface of the base substrate, the plurality of second light-transmitting openings comprise a first light-transmitting sub-opening at least partially overlapping with the first light-transmitting portion and a second light-transmitting sub-opening at least partially overlapping with the second light-transmitting portion; and in a direction parallel to the surface of the base substrate, a plane shape of the first light-transmitting sub-opening is different from a plane shape of the second light-transmitting sub-opening.

For example, in the display substrate provided by at least one embodiment of the present disclosure, a ratio of an area of the first light-transmitting sub-opening to an area of the second light-transmitting sub-opening is greater than or equal to 2.

For example, in the display substrate provided by at least one embodiment of the present disclosure, the ratio of the area of the first light-transmitting sub-opening to the area of the second light-transmitting sub-opening is in a range of (3~4):1.

For example, in the display substrate provided by at least one embodiment of the present disclosure, the plurality of sub-pixels further comprise a third sub-pixel, a pixel driving circuit of the third sub-pixel has a third light-transmitting portion, and in the direction perpendicular to the surface of the base substrate, the plurality of second light-transmitting openings further comprise a third light-transmitting sub-opening at least partially overlapping with the third light-transmitting portion; and in the direction parallel to the surface of the base substrate, a plane shape of the third light-transmitting sub-opening is different from the plane shape of the first light-transmitting sub-opening and the plane shape of the second light-transmitting sub-opening, and an area of the third light-transmitting sub-opening is larger than the area of the second light-transmitting sub-opening, and is substantially equal to the area of the first light-transmitting sub-opening.

For example, in the display substrate provided by at least one embodiment of the present disclosure, a ratio of the area of the first light-transmitting sub-opening, the area of the second light-transmitting sub-opening, and the area of the third light-transmitting sub-opening is in a range of (3~4):1:(3~4).

For example, in the display substrate provided by at least one embodiment of the present disclosure, the plurality of sub-pixels further comprise a fourth sub-pixel, a pixel driving circuit of the fourth sub-pixel has a fourth light-transmitting portion, and in the direction perpendicular to the surface of the base substrate, the plurality of second light-transmitting openings further comprise a fourth light-transmitting sub-opening at least partially overlapping with the fourth light-transmitting portion; and in the direction parallel to the surface of the base substrate, a plane shape of the fourth light-transmitting sub-opening is different from the plane shape of the first light-transmitting sub-opening, the plane shape of the second light-transmitting sub-opening, and the plane shape of the third light-transmitting sub-opening, and an area of the fourth light-transmitting sub-opening is smaller than the area of the third light-transmitting sub-opening and the area of the first light-transmitting sub-opening, respectively, and is larger than the area of the second light-transmitting sub-opening.

For example, in the display substrate provided by at least one embodiment of the present disclosure, a ratio of the area of the first light-transmitting sub-opening, the area of the second light-transmitting sub-opening, the area of the third light-transmitting sub-opening, and the area of the fourth light-transmitting sub-opening is in a range of (3~4):1:(3~4):(2.5~3.5).

For example, in the display substrate provided by at least one embodiment of the present disclosure, the plurality of second light-transmitting openings are arranged in an array comprising a plurality of rows and columns.

For example, in the display substrate provided by at least one embodiment of the present disclosure, the first sub-pixel is a red sub-pixel, the second sub-pixel is a green sub-pixel, the third sub-pixel is a blue sub-pixel, and the fourth sub-pixel is a green sub-pixel; and one first sub-pixel, one second sub-pixel, one third sub-pixel, and one fourth sub-pixel are configured as a repeating unit, and a plurality of repeating units are arranged in an array on the base substrate.

For example, the display substrate provided by at least one embodiment of the present disclosure further comprises a color film layer, the color film layer comprises a plurality of color film patterns respectively covering the plurality of first light-transmitting openings; in the direction perpendicular to the surface of the base substrate, the plurality of color film patterns comprise a first color film pattern at least partially overlapping with a light-emitting device of the first sub-pixel and a second color film pattern at least partially overlapping with a light-emitting device of the second sub-pixel; and in the direction parallel to the surface of the base substrate, a plane shape of the first color film pattern is different from a plane shape of the second color film pattern, and an area of the first color film pattern is larger than an area of the second color film pattern.

For example, in the display substrate provided by at least one embodiment of the present disclosure, a ratio of the area of the first color film pattern to the area of the second color film pattern is in a range of (1~1.5):1.

For example, in the display substrate provided by at least one embodiment of the present disclosure, the first color film pattern is substantially rectangular, and the second color film pattern is substantially semi-elliptical.

For example, in the display substrate provided by at least one embodiment of the present disclosure, the plurality of color film patterns further comprise a third color film pattern at least partially overlapping with a light-emitting device of the third sub-pixel; and in the direction parallel to the surface of the base substrate, a plane shape of the third color film pattern is different from the plane shape of the first color film pattern and the plane shape of the second color film pattern, and an area of the third color film pattern is larger than the area of the first color film pattern and the area of the second color film pattern, respectively.

For example, in the display substrate provided by at least one embodiment of the present disclosure, a ratio of the area of the first color film pattern, the area of the second color film pattern, and the area of the third color film pattern is in a range of (1~1.5):1:(1~1.6).

For example, in the display substrate provided by at least one embodiment of the present disclosure, in the direction perpendicular to the surface of the base substrate, the plurality of color film patterns further comprise a fourth color film pattern at least partially overlapping with a light-emitting device of the fourth sub-pixel; and in the direction parallel to the surface of the base substrate, a plane shape of the fourth color film pattern is substantially same as the plane shape of the second color film pattern, and an area of the fourth color film pattern is substantially equal to the area of the second color film pattern.

For example, in the display substrate provided by at least one embodiment of the present disclosure, in the direction perpendicular to the surface of the base substrate, the fourth color film pattern partially overlaps with the fourth light-transmitting sub-opening.

For example, in the display substrate provided by at least one embodiment of the present disclosure, a minimum distance between edges of the plurality of color film patterns and edges of the plurality of second light-transmitting openings ranges from 1 μm to 5 μm.

For example, the display substrate provided by at least one embodiment of the present disclosure further comprises a planarization layer on the side of the driving circuit layer away from the base substrate and a pixel definition layer on a side of the planarization layer away from the base substrate, the pixel definition layer comprises a plurality of sub-pixel openings; the light-emitting device comprises a first electrode layer, a light-emitting material layer and a second electrode layer that are sequentially stacked in a direction away from the base substrate, the first electrode layer is on the side of the planarization layer away from the base substrate, the pixel definition layer is on a side of the first electrode layer away from the base substrate, and the plurality of sub-pixel openings respectively expose first electrode layers of the light-emitting devices of the plurality of sub-pixels; and for one first light-transmitting opening and one sub-pixel opening corresponding to a same sub-pixel, a plane shape of the one first light-transmitting opening is substantially same as a plane shape of the one sub-pixel opening.

For example, in the display substrate provided by at least one embodiment of the present disclosure, an orthographic projection of the one sub-pixel opening on the base substrate completely overlaps with an orthographic projection of the one first light-transmitting opening on the base substrate, or the orthographic projection of the one sub-pixel opening on the base substrate is located inside the orthographic projection of the one first light-transmitting opening on the base substrate.

For example, in the display substrate provided by at least one embodiment of the present disclosure, for one color film pattern and one sub-pixel opening corresponding to a same sub-pixel, a plane shape of the one color film pattern is different from a plane shape of the one sub-pixel opening.

For example, in the display substrate provided by at least one embodiment of the present disclosure, at least part of edges of the plurality of second light-transmitting openings are parallel to at least part of edges of the color film patterns adjacent to the part of edges of the plurality of second light-transmitting openings.

For example, in the display substrate provided by at least one embodiment of the present disclosure, the first electrode layer comprises a main body portion and a connection portion, the connection portion is configured to be electrically connected to the pixel driving circuit, and the orthographic projection of the sub-pixel opening on the base substrate is located inside an orthographic projection of the main body portion on the base substrate.

For example, the display substrate provided by at least one embodiment of the present disclosure further comprises a plurality of connection electrodes on a side of the planarization layer close to the base substrate, first electrode layers of the light-emitting devices of the plurality of sub-pixels are respectively electrically connected to the plurality of connection electrodes through a plurality of vias in the planarization layer, and the plurality of connection electrodes are electrically connected to pixel driving circuits of the plurality of sub-pixels, and in the direction perpendicular to the surface of the base substrate, the connection electrode at least partially overlaps with the connection portion of the first electrode layer.

For example, in the display substrate provided by at least one embodiment of the present disclosure, the pixel driving circuit layer further comprises a power supply line, and in the direction perpendicular to the surface of the base substrate, the power supply line at least partially overlaps with the main body portion of the first electrode layer.

For example, the display substrate provided by at least one embodiment of the present disclosure further comprises a touch control structure between the light-emitting device layer and the black matrix layer, the touch control structure at least partially overlaps with connection portions of the first electrode layers of the light-emitting devices in at least part of the plurality of sub-pixels.

For example, in the display substrate provided by at least one embodiment of the present disclosure, the touch control structure comprises a first conductive layer, and the first conductive layer comprises a first pattern formed by a plurality of first lines; and in the direction perpendicular to the surface of the base substrate, the first pattern at least partially overlaps with the connection portions of the first electrode layers of the light-emitting devices in at least part of the plurality of sub-pixels.

For example, in the display substrate provided by at least one embodiment of the present disclosure, in the direction perpendicular to the surface of the base substrate, the first pattern at least partially overlaps with connection portions of the first electrode layers of the light-emitting devices of the first sub-pixel and the third sub-pixel.

For example, in the display substrate provided by at least one embodiment of the present disclosure, the touch control structure further comprises a second conductive layer on a side of the first conductive layer away from the base substrate, the second conductive layer comprises a second pattern formed by a plurality of second lines, and in the direction perpendicular to the surface of the base substrate, the second pattern at least partially overlaps with connection portions of the first electrode layers of the light-emitting devices in at least part of the plurality of sub-pixels.

For example, in the display substrate provided by at least one embodiment of the present disclosure, in the direction perpendicular to the surface of the base substrate, the second pattern at least partially overlaps with connection portions of the first electrode layers of the light-emitting devices of the first sub-pixel, the second sub-pixel, and the third sub-pixel.

For example, in the display substrate provided by at least one embodiment of the present disclosure, in the direction perpendicular to the surface of the base substrate, the first pattern and the second pattern do not overlap with the plurality of second light-transmitting openings.

For example, in the display substrate provided by at least one embodiment of the present disclosure, in the direction perpendicular to the surface of the base substrate, at least part of the plurality of color film patterns partially overlap with the first pattern and the second pattern.

For example, in the display substrate provided by at least one embodiment of the present disclosure, edges of at least part of the plurality of color film patterns are parallel to part lines among the plurality of first lines and the plurality of second lines.

For example, in the display substrate provided by at least one embodiment of the present disclosure, in the direction parallel to the surface of the base substrate, an area of a sub-pixel opening corresponding to the first sub-pixel is larger than an area of a sub-pixel opening corresponding to the second sub-pixel, and in the direction perpendicular to the surface of the base substrate, an overlapping area of a first color film pattern corresponding to the first sub-pixel overlapping with the first pattern and the second pattern is larger than an overlapping area of a second color film pattern corresponding to the second sub-pixel overlapping with the first pattern and the second pattern.

At least one embodiment of the present disclosure further provides a display device, the display device includes the display substrate provided by embodiments of the present disclosure.

For example, the display device provided by at least one embodiment of the present disclosure further comprises a texture touch surface and an image sensor array, the image sensor array is on a side of the driving circuit layer away from the light-emitting device layer, and comprises a plurality of image sensors, and the plurality of image sensors are configured to receive light, emitted from a plurality of light-emitting devices in the light-emitting device layer, reflected by a texture on the texture touch surface, and reaching the plurality of image sensors through the plurality of second light-transmitting openings, for texture collection.

BRIEF DESCRIPTION OF THE DRAWINGS

In order to clearly illustrate the technical solutions of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
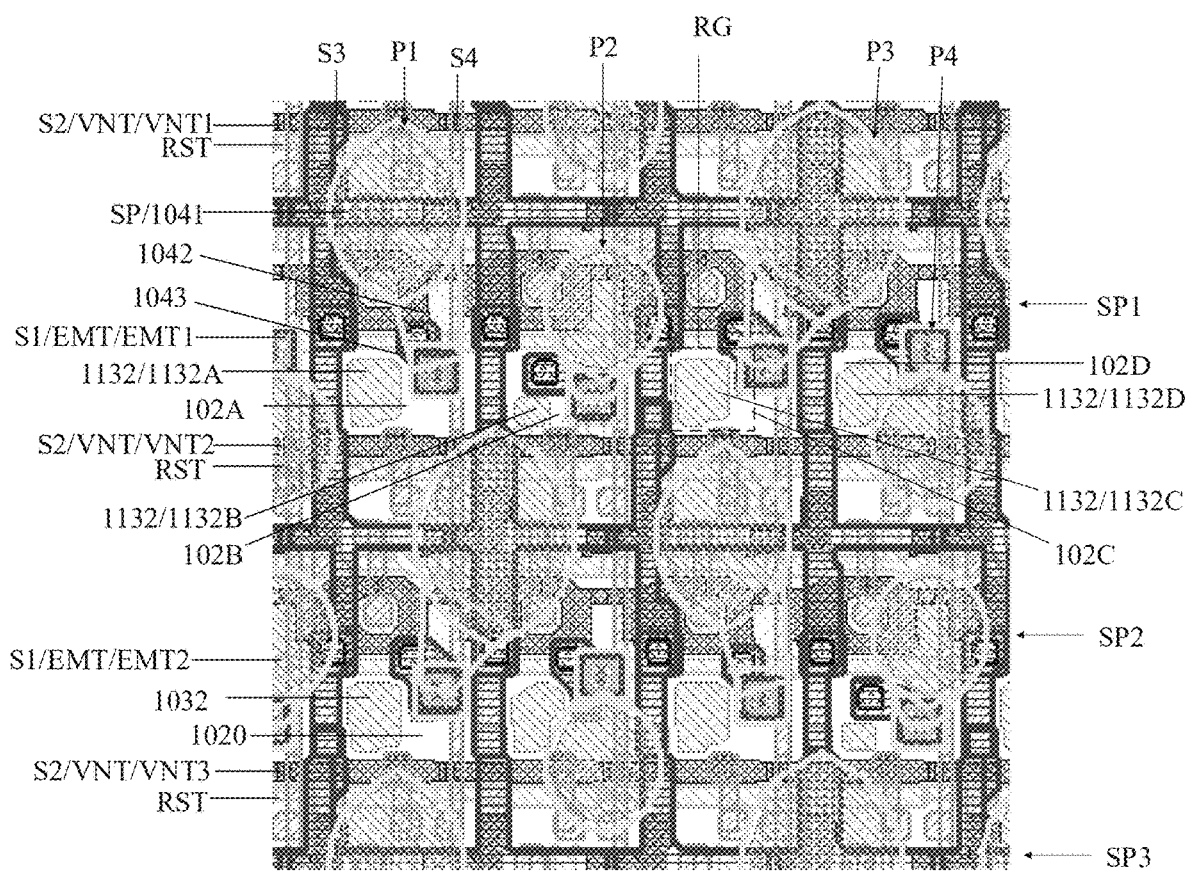
FIG. 1 is schematic plan view of a display substrate provided by at least one embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," and similar terms are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The terms "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In order to prevent the screen from reflecting light, in the traditional OLED display substrate, a layer of polarizer is usually attached on the display substrate to improve the use comfort of the display substrate under ambient light. However, the inventor(s) of the present disclosure found that the transmittance of the polarizer is usually only about 40%, resulting in a low light extraction rate of the display substrate, which leads to a higher power consumption of the display substrate.

In some embodiments, the COE (Cover film On Encapsulation) technology, that is, a technology that uses a color film (CF) to replace the polarizer, can be used to improve the light extraction rate of the display substrate, and this technology is beneficial to the development of the display substrate in the direction of high integration and thinness. In the COE technology, a black matrix layer is formed on the display substrate, and the black matrix layer has a light-transmitting opening at the position corresponding to a light-emitting device of a sub-pixel to transmit the light emitted by the light-emitting device of the sub-pixel, and the above-mentioned color film is provided in this light-transmitting opening. In this case, the black matrix layer can absorb light, thereby blocking part of the metals in the display substrate and reducing the light reflectivity of the display substrate. Furthermore, the non-display side of the display substrate is usually provided with a photosensitive element, such as an image sensor, etc., to realize functions such as fingerprint recognition, and the like; in this case, the display substrate also needs to have a certain light transmittance, so that the signal light incident from the display side of the display substrate can pass through the display substrate to reach the non-display side of the display substrate.

For example, the black matrix layer is also formed with a plurality of small holes through which the signal light for fingerprint recognition passes, and these small holes are usually in the shape of regular shape and substantially the same size, such as a rectangle or a circle, so that the signal light can pass through. However, the inventor(s) of the present disclosure found that these small holes in the shape of a rectangle or a circle are difficult to realize in the manufacturing process, for example, the process precision is difficult to control, resulting in these small holes being too close to or connected with the light-transmitting openings for transmitting the light emitted by the light-emitting devices of the sub-pixels, thereby affecting the display effect of the display substrate.

At least one embodiment of the present disclosure provides a display substrate and a display device. The display substrate has a plurality of sub-pixels arranged in an array, and includes a base substrate, a driving circuit layer on the base substrate, a light-emitting device layer on a side of the driving circuit layer away from the base substrate, and a black matrix layer on a side of the light-emitting device layer away from the base substrate. Each of the plurality of sub-pixels includes a pixel driving circuit provided in the driving circuit layer and a light-emitting device provided in the light-emitting device layer, the pixel driving circuit is configured to drive the light-emitting device, and the black matrix layer has a plurality of first light-transmitting openings respectively exposing light-emitting devices of the plurality of sub-pixels in a direction perpendicular to a surface of the base substrate, and a plurality of second light-transmitting openings respectively located between the plurality of first light-transmitting openings. The driving circuit layer includes a plurality of light-transmitting portions, and each of the plurality of second light-transmitting openings is provided corresponding to at least one of the plurality of light-transmitting portions for transmitting light in a predetermined angle range with the surface of the display substrate.

In the above-mentioned display substrate provided by the embodiments of the present disclosure, the signal light for functions such as texture recognition can sequentially pass through the plurality of second light-transmitting openings and the plurality of light-transmitting portions to reach the photosensitive element such as an image sensor provided on the back side of the display substrate for the photosensitive element to work, such as performing a texture recognition operation.

For example, the plurality of sub-pixels include a first sub-pixel and a second sub-pixel, the pixel driving circuit of the first sub-pixel has a first light-transmitting portion, and the pixel driving circuit of the second sub-pixel has a second light-transmitting portion. In the direction perpendicular to the surface of the base substrate, the plurality of second light-transmitting openings include a first light-transmitting sub-opening at least partially overlapping with the first light-transmitting portion and a second light-transmitting sub-opening at least partially overlapping with the second light-transmitting portion; and in the direction parallel to the surface of the base substrate, the plane shape of the first light-transmitting sub-opening is different from the plane shape of the second light-transmitting sub-opening, for example, the ratio of the area of the first light-transmitting sub-opening to the area of the second light-transmitting sub-opening is greater than or equal to 2.

In the above-mentioned display substrate provided by the embodiments of the present disclosure, because the sizes, dimensions and arrangement positions of the light-emitting devices of different sub-pixels are different, by correspondingly providing second light-transmitting openings of different shapes and dimensions for different sub-pixels, different second light-transmitting openings can be designed according to the differences of different sub-pixels, so that the second light-transmitting openings can fully realize the light transmission while maintaining the original arrangement of the sub-pixels. In addition, the above-mentioned arrangement is beneficial to the manufacturing process and improves the process precision, thereby improving the production yield of the display substrate and improving the display effect of the display substrate.

The display substrate and the display device provided by the embodiments of the present disclosure will be described below by several specific examples.

Figure 2A:
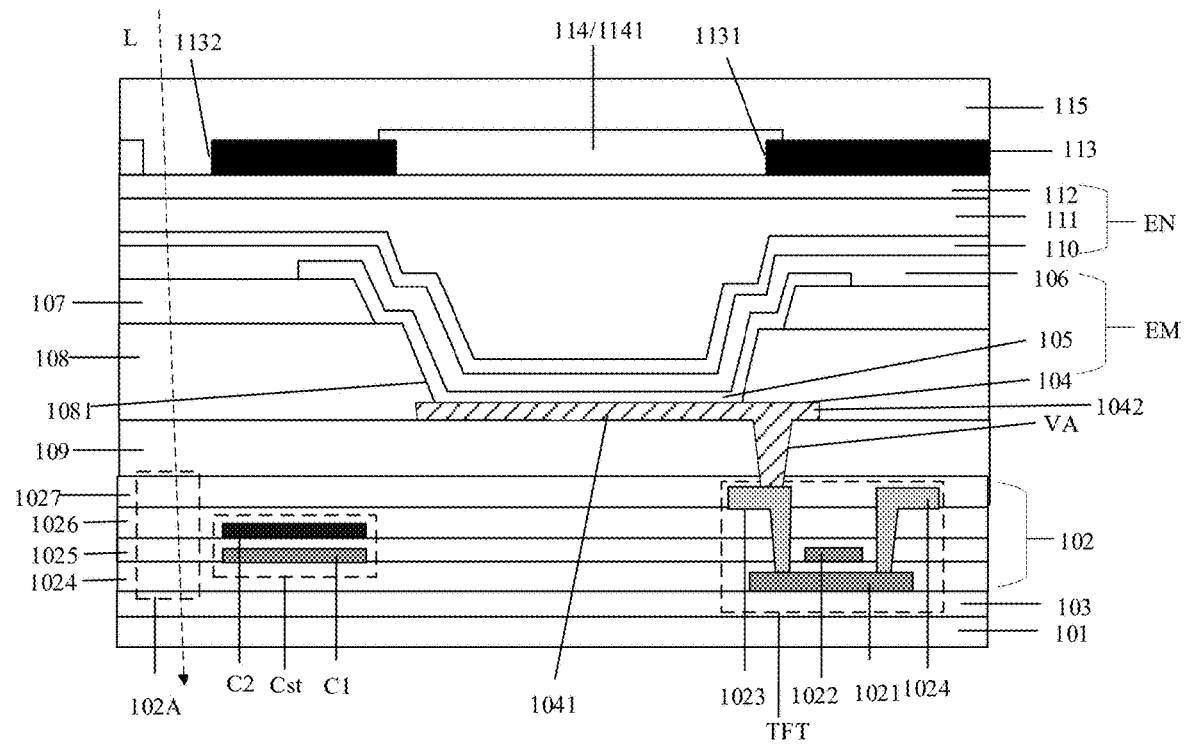
FIG. 2A is a schematic cross-sectional view of a display substrate provided by at least one embodiment of the present disclosure.

At least one embodiment of the present disclosure provides a display substrate, FIG. 1 shows a schematic plan view of the display substrate, and FIG. 2A shows a schematic partial cross-sectional view of the display substrate.

As shown in FIG. 1 and FIG. 2A, the display substrate has a plurality of sub-pixels arranged in an array, and includes a base substrate 101, a driving circuit layer 102 provided on the base substrate 101, a light-emitting device layer provided on a side of the driving circuit layer 102 away from the base substrate 101, and a black matrix layer 113 provided on a side of the light-emitting device layer away from the base substrate 101. Each sub-pixel includes a pixel driving circuit provided in the driving circuit layer 102 and a light-emitting device EM provided in the light-emitting device layer, and the pixel driving circuit is configured to drive the light-emitting device EM.

For example, as shown in FIG. 2A, the pixel driving circuit includes at least one thin film transistor TFT and a storage capacitor Cst, and the thin film transistor TFT includes an active layer 1021, a gate electrode 1022, a source electrode 1023, a drain electrode 1024, and the like provided on the base substrate 101. The source electrode 1023 of the thin film transistor TFT is electrically connected to a first electrode layer 104 of the light-emitting device EM. The storage capacitor Cst includes a first capacitor electrode C1 and a second capacitor electrode C2 provided on the base substrate 101, the first capacitor electrode C1 is provided in the same layer as the gate electrode 1022, and the second capacitor electrode C2 is provided on a side of the first capacitor electrode C1 away from the base substrate 101.

For example, as shown in FIG. 2A, the display substrate further includes a buffer layer 103 provided on the base substrate 101, a first gate insulating layer 1024 provided on the active layer 1021, a second gate insulating layer 1025 provided on the gate electrode 1022 and the first capacitor electrode C1, a interlayer insulating layer 1026 provided on the second capacitor electrode C2, a passivation layer 1027 provided on the source electrode 1023 and the drain electrode 1024, and other structures.

For example, the pixel driving circuit may be formed into a 2T1C structure (including two thin film transistors and one storage capacitor), a 6T1C structure (including six thin film transistors and one storage capacitor), or the like, and therefore include a plurality of thin film transistors, and the plurality of thin film transistors have a stacked structure similar or identical to that of the thin film transistor shown in FIG. 2A. FIG. 2A only shows the thin film transistor directly connected to the light-emitting device, and the thin film transistor may be a driving thin film transistor, or a light-emitting control thin film transistor, or the like.

Figure 2B:
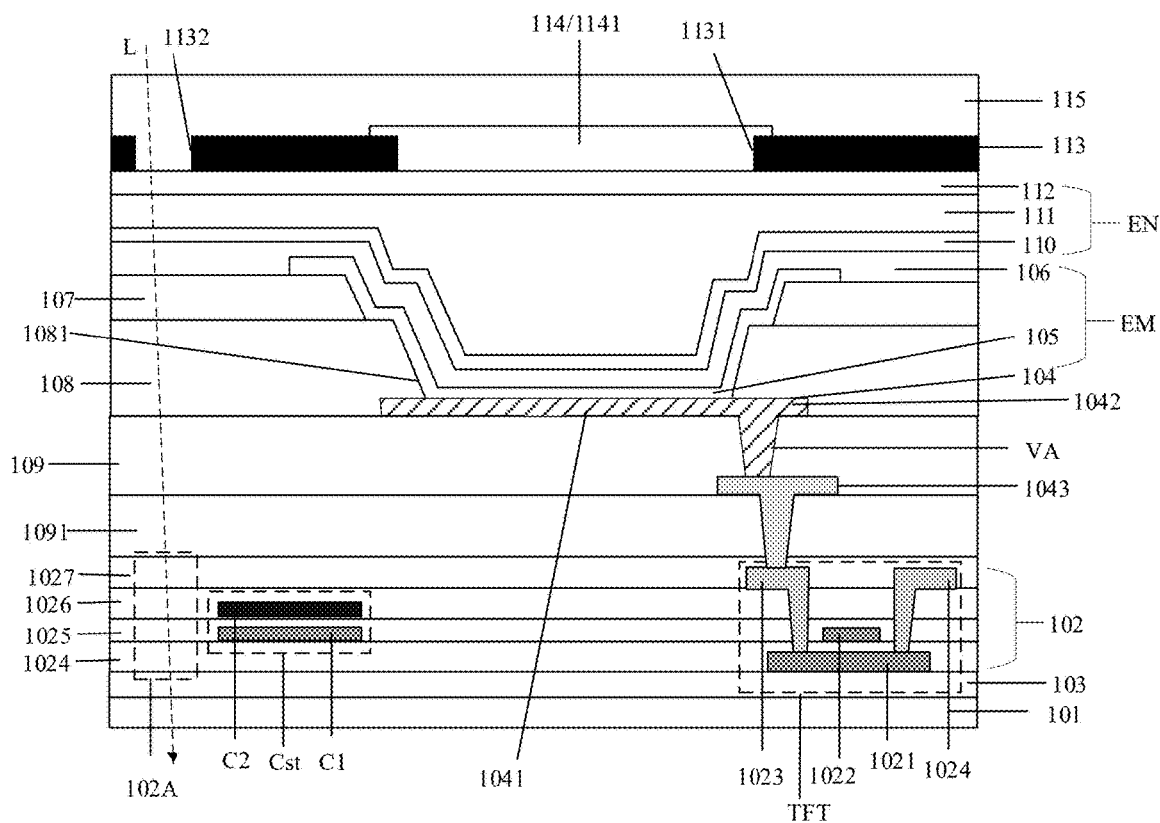
FIG. 2B is another schematic cross-sectional view of a display substrate provided by at least one embodiment of the present disclosure.

For example, FIG. 2B shows another schematic partial cross-sectional view of a display substrate provided by at least one embodiment of the present disclosure. In this embodiment, as shown in FIG. 2B, the display substrate further includes a connection electrode 1043, and the first electrode layer 104 of the light-emitting device EM is electrically connected to the pixel driving circuit through the connection electrode 1043. In this case, the first electrode layer 104 is connected to the connection electrode 1043 through a via VA in a planarization layer 109 (detailed later), and the connection electrode 1043 is connected to the source electrode 1023 of the thin film transistor TFT through a via in another planarization layer 1091 (detailed later). For example, in the direction perpendicular to the surface of the base substrate, the connection electrode 1043 at least partially overlaps with a connection portion 1042 (described later) of the first electrode layer 104. For other structures of the display substrate shown in FIG. 2B, reference may be made to the display substrate shown in FIG. 2A, which will not be repeated here.

It should be noted that, in the embodiments of the present disclosure, "provided in the same layer" means that two or more functional layers (or structural layers) are formed in the same layer and with the same material in the hierarchical structure of the display substrate, that is, during the manufacturing process, the two or more functional layers (or structural layers) are formed by the same material layer, and required patterns and structures are formed by the same patterning process.

For example, the black matrix layer 113 includes a plurality of first light-transmitting openings 1131 respectively exposing the light-emitting devices EM of the plurality of sub-pixels in the direction perpendicular to the surface of the base substrate 101, and includes a plurality of second light-transmitting openings 1132 respectively located between the plurality of first light-transmitting openings 1131. The plurality of first light-transmitting openings 1131 are respectively used to transmit the light emitted by the light-emitting devices EM of the plurality of sub-pixels, and the plurality of second light-transmitting openings 1132 are, for example, used to transmit signal light required by the photosensitive element such as an image sensor provided on the non-display side of the display substrate.

For example, the driving circuit layer includes a plurality of light-transmitting portions, and each of the plurality of second light-transmitting openings 1132 is provided corresponding to at least one of the plurality of light-transmitting portions for transmitting light which is in a predetermined angle range with the surface of the display substrate. For example, the plurality of second light-transmitting openings 1132 are arranged in an array including a plurality of rows and columns, and correspondingly, the plurality of light-transmitting portions are also arranged in an array including a plurality of rows and columns.

For example, as shown in FIG. 1, the plurality of sub-pixels include a first sub-pixel P1 and a second sub-pixel P2, and the plurality of light-transmitting portions include a first light-transmitting portion 102A included in a pixel driving circuit of the first sub-pixel P1 and a second light-transmitting portion 102B included in a pixel driving circuit of the second sub-pixel P2. In the direction perpendicular to the surface of the base substrate 101, the plurality of second light-transmitting openings 1132 include a first light-transmitting sub-opening 1132A at least partially overlapping with the first light-transmitting portion 102A and a second light-transmitting sub-opening 1132B at least partially overlapping with the second light-transmitting portion 102B. In the direction parallel to the surface of the base substrate 101, the plane shape of the first light-transmitting sub-opening 1132A is different from the plane shape of the second light-transmitting sub-opening 1132B. For example, in some embodiments, the ratio of the area of the first light-transmitting sub-opening 1132A to the area of the second light-transmitting sub-opening 1132B is greater than or equal to 2.

For example, the light-transmitting portions 102A and 102B of the pixel driving circuit include light-transmitting insulating materials, and the light-transmitting insulating materials include light-transmitting insulating materials of insulating layers such as the first gate insulating layer 1024, the second gate insulating layer 1025, the interlayer insulating layer 1026, and the passivation layer 1027.

For example, as shown in FIG. 1, in some examples, the plane shape of the first light-transmitting sub-opening 1132A is an irregular shape and has an outline at least partially similar to an outline of the first light-transmitting sub-opening 102A, and the orthographic projection of the first light-transmitting sub-opening 1132A on the base substrate 101 is located inside the orthographic projection of the first light-transmitting portion 102A on the base substrate 101. For example, the plane shape of the second light-transmitting sub-opening 1132B is substantially rectangular, and the orthographic projection of the second light-transmitting sub-opening 1132B on the base substrate 101 is located inside the orthographic projection of the second light-transmitting portion 102B on the base substrate 101. Therefore, the first light-transmitting portion 102A together with the first light-transmitting sub-opening 1132A can transmit light in a certain angle with the surface of the base substrate 101, the second light-transmitting portion 102B together with the second light-transmitting sub-opening 1132B can transmit light in a certain angle with the surface of the base substrate 101, and the light can be transmitted to the non-display side of the display panel for the photosensitive element, such as an image sensor, provided on the non-display side of the display panel to work.

For example, in some embodiments, the ratio of the area of the first light-transmitting sub-opening 1132A to the area of the second light-transmitting sub-opening 1132B is in a range of (3~4):1, such as 3:1, 3.5:1, 3.8:1, or the like. The second light-transmitting sub-opening 1132B has a small area to avoid the pixel driving circuit of the second sub-pixel and its connection circuit, so as to prevent the signal light from irradiating these circuits to cause reflection and adverse effects on these circuits.

For example, in some embodiments, as shown in FIG. 1, the plurality of sub-pixels further includes a third sub-pixel P3, and the pixel driving circuit of the third sub-pixel P3 has a third light-transmitting portion 1132C. In the direction perpendicular to the surface of the base substrate 101, the plurality of second light-transmitting openings 1132 further include a third light-transmitting sub-opening 102C at least partially overlapping with the third light-transmitting portion 1132C, and in the direction parallel to the surface of the base substrate 101, the plane shape of the third light-transmitting sub-opening 102C is different from the plane shape of the first light-transmitting sub-opening 102A and the plane shape of the second light-transmitting sub-opening 102B, and the area of the third light-transmitting sub-opening 102C is larger than the area of the second light-transmitting sub-opening 102B, and is substantially equal to the area of the first light-transmitting sub-opening 102A. For example, the difference between the area of the third light-transmitting sub-opening 102C and the area of the first light-transmitting sub-opening 102A is not greater than 10% of the area of the third light-transmitting sub-opening 102C, for example, the area of the third light-transmitting sub-opening 102C is slightly larger or slightly smaller than the area of the first light-transmitting sub-opening 102A.

For example, the plane shape of the third light-transmitting sub-opening 1132C is an irregular shape, that is, the plane shape is not a basic shape such as a rectangle, a circle, etc., and has an outline at least partially similar to the outline of the third light-transmitting sub-opening 102C, and the orthographic projection of the third light-transmitting sub-opening 1132C on the base substrate 101 is located inside the orthographic projection of the third light-transmitting portion 102C on the base substrate 101. Therefore, the third light-transmitting portion 102C together with the third light-transmitting sub-opening 1132C can transmit light in a certain angle with the surface of the base substrate 101, and the light can be transmitted to the non-display side of the display panel for the photosensitive element, such as an image sensor, provided on the non-display side of the display panel to work.

For example, in some embodiments, the ratio of the area of the first light-transmitting sub-opening 1132A, the area of the second light-transmitting sub-opening 1132B, and the area of the third light-transmitting sub-opening 1132C is in a range of (3~4):1:(3~4), such as 3:1:3, 3.5:1:3.5, 3.8:1:3.9, or the like.

For example, in some embodiments, as shown in FIG. 1, the plurality of sub-pixels further includes a fourth sub-pixel P4, and the pixel driving circuit of the fourth sub-pixel P4 has a fourth light-transmitting portion 102D. In the direction perpendicular to the surface of the base substrate 101, the plurality of second light-transmitting openings 1132 further include a fourth light-transmitting sub-opening 1132D at least partially overlapping with the fourth light-transmitting portion 102D, and in the direction parallel to the surface of the base substrate 101, the plane shape of the fourth light-transmitting sub-opening 1132D is different from the plane shape of the first light-transmitting sub-opening 1132A, the plane shape of the second light-transmitting sub-opening 1132B, and the plane shape of the third light-transmitting sub-opening 1132C, and the area of the fourth light-transmitting sub-opening 1132D is smaller than the area of the third light-transmitting sub-opening 1132C and the area of the first light-transmitting sub-opening 1132A, respectively, and is larger than the area of the second light-transmitting sub-opening 1132B.

For example, the plane shape of the fourth light-transmitting sub-opening 1132D is an irregular shape and has an outline at least partially similar to the outline of the fourth light-transmitting portion 102D, and the orthographic projection of the fourth light-transmitting sub-opening 1132D on the base substrate 101 is located inside the orthographic projection of the fourth light-transmitting portion 102D on the base substrate 101. Therefore, the fourth light-transmitting portion 102D together with the fourth light-transmitting sub-opening 1132D can transmit light in a certain angle with the surface of the base substrate 101, and the light can be transmitted to the non-display side of the display panel for the photosensitive element, such as an image sensor, provided on the non-display side of the display panel to work.

For example, in some embodiments, the ratio of the area of the first light-transmitting sub-opening 1132A, the area of the second light-transmitting sub-opening 1132B, the area of the third light-transmitting sub-opening 1132C, and the area of the fourth light-transmitting sub-opening 1132D is in a range of (3~4):1:(3~4):(2.5~3.5), such as 3:1:3:2.5, 3.5:1:3.5:3, 3.8:1:3.9:3.1, or the like.

For example, in some embodiments, the first sub-pixel P1 is a red sub-pixel, the second sub-pixel P2 is a green sub-pixel, the third sub-pixel P3 is a blue sub-pixel, and the fourth sub-pixel P4 is a green sub-pixel. One first sub-pixel P1, one second sub-pixel P2, one third sub-pixel P3, and one fourth sub-pixel P4 are configured as a repeating unit, and a plurality of repeating units are arranged in an array on the base substrate 101.

Thus, the first light-transmitting sub-opening 1132A, the second light-transmitting sub-opening 1132B, the third light-transmitting sub-opening 1132C, and the fourth light-transmitting sub-opening 1132D corresponding to the plurality of sub-pixels in each repeating unit can be sufficiently arranged for respective sub-pixel, so as to improve the transmittance of the signal light without affecting the display effect of the display substrate.

For example, in some embodiments, as shown in FIG. 1, the driving circuit layer 102 further includes a first signal line S1 and a second signal line S2 arranged in parallel to each other and arranged periodically, and the first signal line S1 and the second signal line S2 are configured to provide different electrical signals to the plurality of sub-pixels SP.

It should be noted that, considering the process errors and structural errors in actual production, the formed signal line may not be a straight line, such as having uneven parts, etc. In the embodiments of the present disclosure, the first signal line S1 and the second signal line S2 are "parallel to each other" may mean that the angle formed between the extending directions of the first signal line S1 and the second signal line S2 is within a range of 15 degrees, but not necessarily parallel in the strict sense.

For example, as shown in FIG. 1, the orthographic projections of the plurality of second light-transmitting openings 1132 on the base substrate 101 are respectively located between the orthographic projection of one first signal line S1 on the base substrate 101 and the orthographic projection of one second signal line S2 closest to the one first signal line S1 on the base substrate 101.

For example, in some embodiments, the first signal line S1 is a light-emitting control signal line EMT, and the second signal line is a reset voltage line VNT, which will be described in detail later.

For example, in some embodiments, the plurality of sub-pixels in rows and columns include a first sub-pixel row SP1 (it is shown in the figure that the first sub-pixel row SP1 includes one row of sub-pixels as an example, in other embodiments, the first sub-pixel row SP1 may also include a plurality of rows of sub-pixels) and a second sub-pixel row SP2 (it is shown in the figure that the second sub-pixel row SP2 includes one row of sub-pixels as an example, in other embodiments, the second sub-pixel row SP2 may also include a plurality of rows of sub-pixels) adjacent to the first sub-pixel row SP1 and located at a lower level (that is, located at a next row of the first sub-pixel row SP1 or scanned after the first sub-pixel row SP1 during circuit scanning) of the first sub-pixel row SP1. The pixel driving circuits of the first sub-pixel row SP1 share one light-emitting control signal line EMT1 and one reset voltage line VNT1, and the pixel driving circuits of the second sub-pixel row SP2 share one light-emitting control signal line EMT2 and one reset voltage line VNT2. In this case, the orthographic projections of one row of second light-transmitting openings 1132 on the base substrate 101 are between the orthographic projection of the light-emitting control signal line EM1 shared by the pixel driving circuits of the first sub-pixel row SP1 on the base substrate 101 and the orthographic projection of the reset voltage line VNT2 shared by the pixel driving circuits of the second sub-pixel row SP2 on the base substrate 101.

For example, as shown in FIG. 1, the plurality of sub-pixels in rows and columns further include a third sub-pixel row SP3 (it is shown in the figure that the third sub-pixel row SP3 includes one row of sub-pixels as an example, in other embodiments, the third sub-pixel row SP3 may also include a plurality of rows of sub-pixels) adjacent to the second sub-pixel row SP2 and located at a lower level of the second sub-pixel row SP2, and the pixel driving circuits of the third sub-pixel row SP3 share one light-emitting control signal line (not shown in the figure) and one reset voltage line VNT3. In this case, the orthographic projections of one row of second light-transmitting openings 1132 on the base substrate 101 are between the orthographic projection of the light-emitting control signal line EM2 shared by the pixel driving circuits of the second sub-pixel row SP2 on the base substrate 101 and the orthographic projection of the reset voltage line VNT3 shared by the pixel driving circuits of the third sub-pixel row SP3 on the base substrate 101.

For example, as shown in FIG. 1, the driving circuit layer further includes a third signal line S3 and a fourth signal line S4 arranged in parallel to each other and arranged periodically, and the third signal lines S3 and the fourth signal lines S4 respectively intersect the first signal line S1 and the second signal line S2, for example, respectively perpendicular to the first signal line S1 and the second signal line S2. The third signal line S3 and the fourth signal line S4 are configured to provide different electrical signals to the plurality of sub-pixels, and the orthographic projections of the plurality of second light-transmitting openings 1032 on the base substrate 101 are respectively located between the orthographic projection of one third signal line S3 on the base substrate 101 and the orthographic projection of one fourth signal line S4 adjacent to the one third signal line S3 on the base substrate 101.

For example, in some embodiments, the third signal line S3 is a first power supply line VDD1, and the fourth signal line S4 is a data line DT, which will be described in detail later.

For example, as shown in FIG. 1, the first signal line S1, the second signal line S2, the third signal line S3, and the fourth signal line S4 define a plurality of first regions RG, that is, the regions circled by the dotted frame in the figure, and the orthographic projections of the plurality of second light-transmitting openings 1032 on the base substrate 101 are respectively located within the orthographic projections of the plurality of first regions RG on the base substrate 101.

For example, as shown in FIG. 1, the orthographic projections of at least part of the plurality of connection electrodes 1043 on the base substrate 10 are located within the orthographic projections of the plurality of first regions RG on the base substrate 10, that is, the orthographic projections of the plurality of connection electrodes 1043 on the base substrate 10 overlap with the orthographic projections of the plurality of first regions RG on the base substrate 10, or the orthographic projections of the plurality of connection electrodes 1043 on the base substrate 10 are respectively located inside the orthographic projections of the plurality of first regions RG on the base substrate 10, referring to FIG. 1.

For example, as shown in FIG. 1, the first signal line S1, the second signal line S2, the third signal line S2, the fourth signal line S4, and the plurality of connection electrodes 1043 together define a plurality of light-transmitting portions 1020, that is, the regions surrounded by the first signal line S1, the second signal line S2, the third signal line S2, the fourth signal line S4, and the plurality of connection electrodes 1043 are the plurality of light-transmitting portions of the driving circuit layer.

For example, in some embodiments, as shown in FIG. 2A and FIG. 2B, the display substrate further includes a color film layer 114, and the color film layer 114 includes a plurality of color film patterns 1141 respectively covering the plurality of first light-transmitting openings 1131 to filter the light emitted by the light-emitting devices EM of the sub-pixels.

Figure 3:
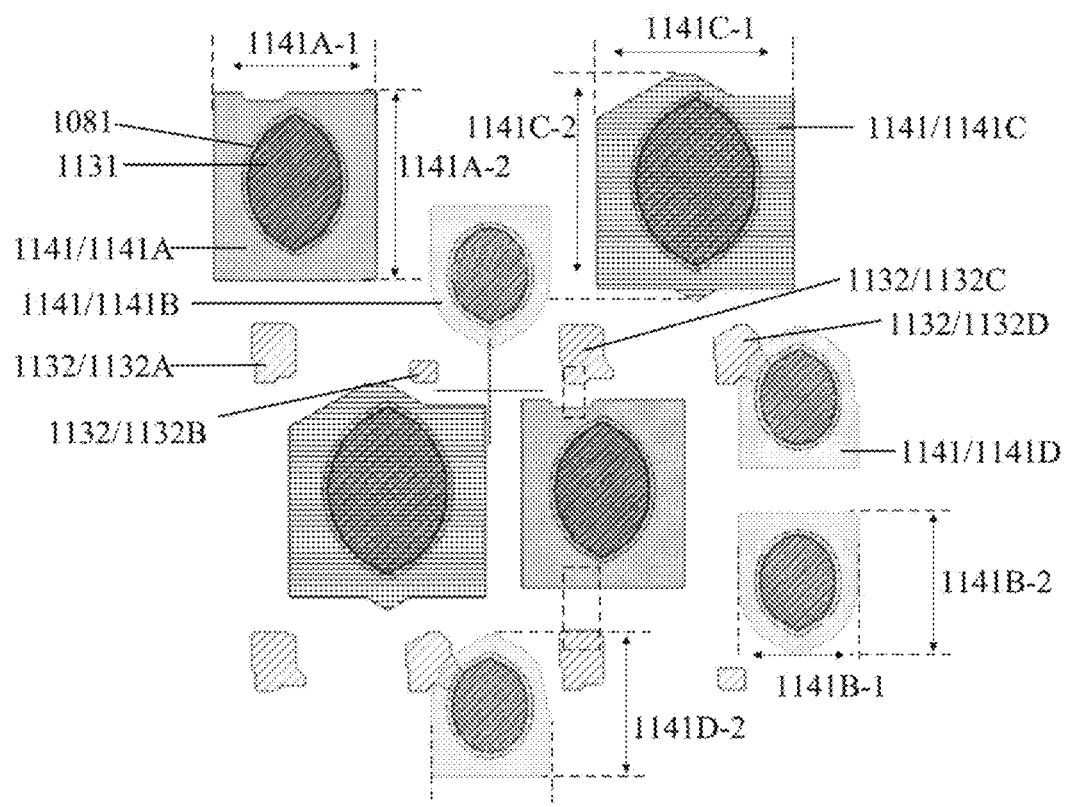
FIG. 3 is a schematic plan view of a black matrix layer and a color film layer in a display substrate provided by at least one embodiment of the present disclosure.

For example, FIG. 3 shows a schematic plan view of the plurality of first light-transmitting openings 1131, the plurality of second light-transmitting openings 1132, and the plurality of color film patterns 1141. As shown in FIG. 3, in the direction perpendicular to the surface of the base substrate 101, the plurality of color film patterns 1141 include a first color film pattern 1141A at least partially overlapping with the light-emitting device of the first sub-pixel P1 and a second color film pattern 1141B at least partially overlapping with the light-emitting device of the second sub-pixel. In the direction parallel to the surface of the base substrate 101, the plane shape of the first color film pattern 1141A is different from the plane shape of the second color film pattern 1141B, and the area of the first color film pattern 1141A is larger than the area of the second color film pattern 1141B.

For example, as shown in FIG. 3, the plane shape of the first color film pattern 1141A is substantially rectangular, such as a rectangle with a notch, and the plane shape of the second color film pattern 1141B is substantially semi-elliptical. For example, the area of the first color film pattern 1141A and the area of the second color film pattern 1141B are respectively larger than the areas of the first light-transmitting openings 1131 covered by them, so as to fully realize the effect of light filtering.

For example, in some examples, the ratio of the area of the first color film pattern 1141A to the area of the second color film pattern 1141B is in a range of (1~1.5):1, such as 1.2:1, 1.4:1, or the like.

For example, as shown in FIG. 3, in the direction perpendicular to the surface of the base substrate 101, the plurality of color film patterns 1141 further include a third color film pattern 1141C at least partially overlapping with the light-emitting device of the third sub-pixel P3. In the direction parallel to the surface of the base substrate 101, the plane shape of the third color film pattern 1141C is different from the plane shape of the first color film pattern 1141A and the plane shape of the second color film pattern 1141B, and the area of the third color film pattern 1141C is larger than the area of the first color film pattern 1141A and the area of the second color film pattern 1141B, respectively. For example, the plane shape of the third color film pattern 1141C is an irregular shape, so as to fully realize the effect of light filtering.

For example, in some embodiments, the ratio of the area of the first color film pattern 1141A, the area of the second color film pattern 1141B, and the area of the third color film pattern 1141C is in a range of (1~1.5):1:(1~1.6), such as 1.2:1:1.1, 1.4:1:1.3, or the like.

For example, as shown in FIG. 3, in the direction perpendicular to the surface of the base substrate 101, the plurality of color film patterns 1141 further include a fourth color film pattern 1141D at least partially overlapping with the light-emitting device of the fourth sub-pixel P4. In the direction parallel to the surface of the base substrate 101, the plane shape of the fourth color film pattern 1141D is substantially the same as the plane shape of the second color film pattern 1141B, and the area of the fourth color film pattern 1141D is substantially equal to the area of the second color film pattern 1141B.

For example, the plane shape of the fourth color film pattern 1141D is substantially semi-elliptical, and the area of the fourth color film pattern 1141D is substantially equal to the area of the second color film pattern 1141D, for example, the difference between the area of the fourth color filter pattern 1141D and the area of the second color filter pattern 1141B is not greater than 10% of the area of the second color filter pattern 1141B.

In the embodiments of the present disclosure, the black matrix layer 113 can absorb the light incident into the display substrate, reduce the reflectivity of the display substrate to external light, and improve the display effect of the display substrate; and by covering the black matrix layer 113 with the color film layer 114, the color film layer 114 can absorb the light incident into the display substrate again to further reduce the reflectivity of the display substrate to external light and improve the display effect of the display substrate. After testing the plurality of color film patterns 1141 shown in FIG. 3, it is found that in the case where the plurality of color film patterns 1141 have the shape and size distribution shown in FIG. 3, the plurality of color film patterns 1141 can fully realize the effect of light filtering as well as the effect of light reflecting, which makes the display effect of the display substrate better.

For example, in some embodiments, as shown in FIG. 3, in the direction perpendicular to the surface of the base substrate 101, the fourth color film pattern 1141D partially overlaps with the fourth light-transmitting sub-opening 1132D.

For example, in some examples, as shown in FIG. 3, the lateral size 1141A-1 of the first color film pattern 1141A corresponding to the first sub-pixel P1 ranges from 27 μm to 33 μm, such as 28 μm, 29 μm, 30 μm, or the like, and the longitudinal size 1141A-2 of the first color film pattern 1141A corresponding to the first sub-pixel P1 ranges from 30 μm to 35 μm, such as 32 μm, 33 μm, 34 μm, or the like; the lateral size 1141B-1 of the second color film pattern 1141B corresponding to the second sub-pixel P2 ranges from 20 μm to 25 μm, such as 21 μm, 22 μm, 23 μm, or the like, and the longitudinal size 1141B-2 of the second color film pattern 1141B corresponding to the second sub-pixel P2 ranges from 23 μm to 28 μm, such as 25 μm, 26 μm, 27 μm, or the like; the lateral size 1141C-1 of the third color film pattern 1141C corresponding to the third sub-pixel P3 ranges from 32 μm to 38 μm, such as 34 μm, 35 μm, 36 μm, or the like, and the longitudinal size 1141C-2 of the third color film pattern 1141C corresponding to the third sub-pixel P3 ranges from 35 μm to 45 μm, such as 38 μm, 40 μm, 42 μm, or the like; and the lateral size 1141D-1 of the fourth color film pattern 1141D corresponding to the fourth sub-pixel P4 ranges from 20 μm to 25 μm, such as 21 μm, 22 μm, 23 μm, or the like, and the longitudinal size 1141D-2 of the fourth color film pattern 1141D corresponding to the fourth sub-pixel P4 ranges from 23 μm to 28 μm, such as 25 μm, 26 μm, 27 μm, or the like For example, the minimum distance between edges of the plurality of color film patterns 1141 and edges of the plurality of second light-transmitting openings 1132 ranges from 1 μm to 5 μm. For example, as shown in FIG. 3, for the color film pattern 1141 and the second light-transmitting opening 1132 that are at least partially adjacent to each other, there is a space between the color film pattern 1141 and the second light-transmitting opening 1132, and the minimum distance between the edges of the color film pattern 1141 and the edges of the second light-transmitting opening 1132 ranges from 1 μm to 5 μm, so as to prevent the color film pattern 1141 from filtering the light passing through the second light-transmitting opening 1132.

For example, as shown in FIG. 2A and FIG. 2B, the display substrate may further include a planarization layer 109 provided on the side of the driving circuit layer 102 away from the base substrate 101 and a pixel definition layer 108 located on a side of the planarization layer 109 away from the base substrate 101. The pixel definition layer 108 includes a plurality of sub-pixel openings 1081, and the light-emitting device EM includes a first electrode layer 104, a light-emitting material layer 105, and a second electrode layer 106 that are sequentially stacked in the direction away from the base substrate 101. The first electrode layer 104 is provided on the side of the planarization layer 109 away from the base substrate 101, the pixel definition layer 108 is provided on the side of the first electrode layer 104 away from the base substrate 101, and the plurality of sub-pixel openings 1081 respectively expose the first electrode layers 104 of the light-emitting devices EM of the plurality of sub-pixels.

Figure 4:
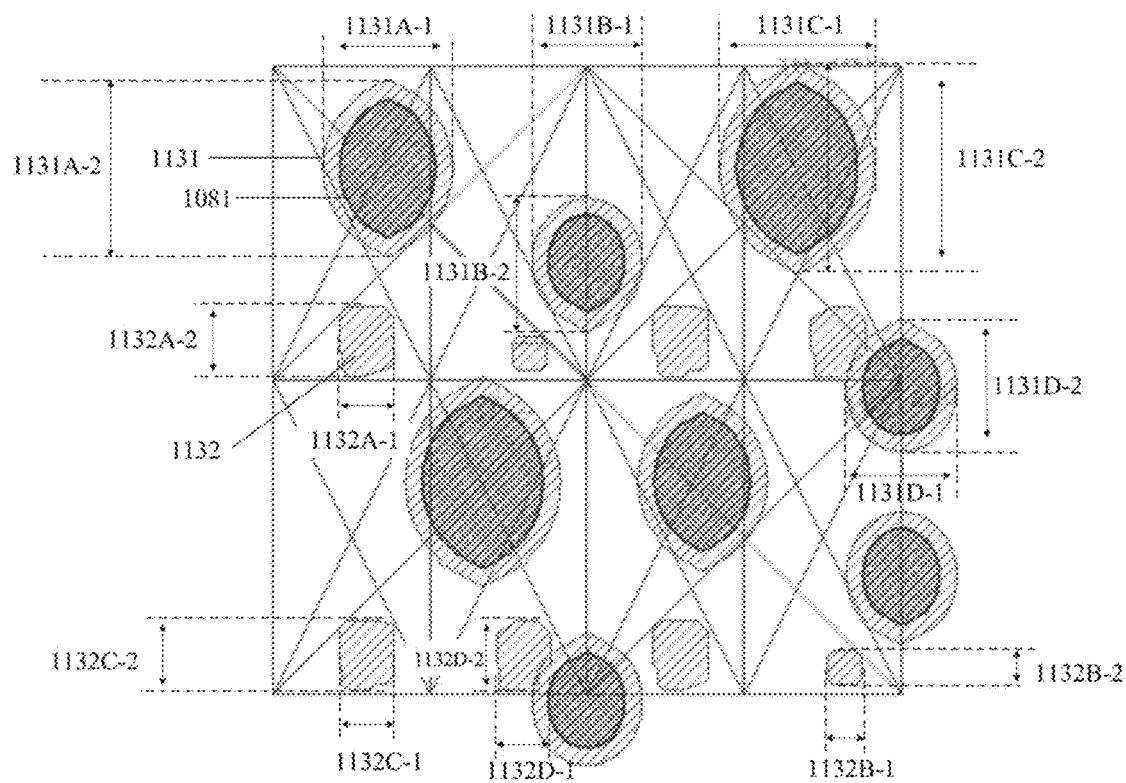
FIG. 4 is a schematic plan view of a black matrix layer in a display substrate provided by at least one embodiment of the present disclosure.

For example, FIG. 4 shows a schematic plan view of the plurality of sub-pixel openings of the pixel definition layer, and the plurality of first light-transmitting openings and the plurality of second light-transmitting openings of the black matrix layer. As shown in FIG. 4, for one first light-transmitting opening 1131 and one sub-pixel opening 1081 corresponding to a same sub-pixel, the plane shape of the one first light-transmitting opening 1131 is substantially the same as the plane shape of the one sub-pixel opening 1081. For example, because the materials of the black matrix layer and the pixel definition layer are different, the forming processes of the first light-transmitting opening 1131 and the sub-pixel opening 1081 may also be different. Therefore, in an actual product, the plane shape of the first light-transmitting opening 1131 and the plane shape of the sub-pixel opening 1081 may be slightly different, but the general shapes are the same.

For example, as shown in FIG. 4, the orthographic projection of the sub-pixel opening 1081 on the base substrate 101 is located inside the orthographic projection of the first light-transmitting opening 1131 on the base substrate 101; or, referring to FIG. 3, the orthographic projection of the sub-pixel opening 1081 on the base substrate 101 completely overlaps with the orthographic projection of the first light-transmitting opening 1131 on the base substrate 101, that is, the overlapping area of the orthographic projection of the sub-pixel opening 1081 on the base substrate 101 and the orthographic projection of the first light-transmitting opening 1131 on the base substrate 101 is not less than 90% of the area of the orthographic projection of the sub-pixel opening 1081 on the base substrate 101, in this case, the plane shape and size of the sub-pixel opening 1081 are substantially the same as the plane shape and size of the first light-transmitting opening 1131.

For example, as shown in FIG. 4, the lateral size 1131A-1 of the first light-transmitting opening corresponding to the first sub-pixel P1 ranges from 15 μm to 20 μm, such as 17 μm, 18 μm, 19 μm, or the like, and the longitudinal size 1131A-2 of the first light-transmitting opening corresponding to the first sub-pixel P1 ranges from 25 μm to 30 μm, such as 26 μm, 27 μm, 28 μm, or the like; the lateral size 1131B-1 of the first light-transmitting opening corresponding to the second sub-pixel P2 ranges from 12 μm to 18 μm, such as 14 μm, 15 μm, 16 μm, or the like, and the longitudinal size 1131B-2 of the first light-transmitting opening corresponding to the second sub-pixel P2 ranges from 15 μm to 20 μm, such as 17 μm, 18 μm, 19 μm, or the like; the lateral size 1131C-1 of the first light-transmitting opening corresponding to the third sub-pixel P3 ranges from 20 μm to 25 μm, such as 22 μm, 23 μm, 24 μm, or the like, and the longitudinal size 1131B-2 of the first light-transmitting opening corresponding to the third sub-pixel P3 ranges from 30 μm to 35 μm, such as 32 μm, 33 μm, 34 μm, or the like; and the lateral size 1131D-1 of the first light-transmitting opening corresponding to the fourth sub-pixel P4 ranges from 10 μm to 18 μm, such as 11 μm, 15 μm, 16 μm, or the like, and the longitudinal size 1131D-2 of the first light-transmitting opening corresponding to the fourth sub-pixel P4 ranges from 15 μm to 20 μm, such as 17 μm, 18 μm, 19 μm, or the like.

For example, as shown in FIG. 4, the maximum lateral size 1132A-1 of the second light-transmitting opening (that is, the first light-transmitting sub-opening) corresponding to the first sub-pixel P1 ranges from 6 μm to 10 μm, such as 7 μm, 8 μm, 9 μm, or the like, and the maximum longitudinal size 1132A-2 of the second light-transmitting opening corresponding to the first sub-pixel P1 ranges from 8 μm to 12 μm, such as 9 μm, 10 μm, 11 μm, or the like; the maximum lateral size 1132B-1 of the second light-transmitting opening (that is, the second light-transmitting sub-opening) corresponding to the second sub-pixel P2 ranges from 3 μm to 6 μm, such as 4 μm, 4.5 μm, 5 μm, or the like, and the maximum longitudinal size 1132B-2 of the second light-transmitting opening corresponding to the second sub-pixel P2 ranges from 2 μm to 5 μm, such as 3 μm, 3.5 μm, 4 μm, or the like; the maximum lateral size 1132C-1 of the second light-transmitting opening (that is, the third light-transmitting sub-opening) corresponding to the third sub-pixel P3 ranges from 6 μm to 10 μm, such as 7 μm, 8 μm, 9 μm, or the like, and the maximum longitudinal size 1132C-2 of the second light-transmitting opening corresponding to the third sub-pixel P3 ranges from 8 μm to 12 μm, such as 9 μm, 10 μm, 11 μm, or the like; and the maximum lateral size 1132D-1 of the second light-transmitting opening (that is, the fourth light-transmitting sub-opening) corresponding to the fourth sub-pixel P4 ranges from 6 μm to 10 μm, such as 7 μm, 8 μm, 9 μm, or the like, and the maximum longitudinal size 1132D-2 of the second light-transmitting opening corresponding to the fourth sub-pixel P4 ranges from 8 µm to 12 µm, such as 9 µm, 10 µm, 11 µm, or the like.

For example, in different embodiments, such as the embodiment shown in FIG. 3 and the embodiment shown in FIG. 4, the shapes of the plurality of second light-transmitting openings may be slightly different, but the size range can refer to FIG. 4 and the above description. Compared with the embodiment of FIG. 3, in the embodiment of FIG. 4, the plurality of second light-transmitting openings are not connected with the plurality of first light-transmitting openings, thereby having a better effect of preventing light leakage.

For example, referring to FIG. 3 and FIG. 4, for one color film pattern 1141 and one sub-pixel opening 1081 corresponding to a same sub-pixel, the plane shape of the one color film pattern 1141 is different from the plane shape of the one sub-pixel opening 1081. For example, at least part of the edges of the plurality of second light-transmitting openings 1132 are parallel to at least part of the edges of the color film patterns 1141 adjacent to the plurality of second light-transmitting openings 1132. For example, in the part shown by the dotted frame in FIG. 3, part of the edges of the second light-transmitting opening 1132 is parallel to part of the edges of the color film pattern 1141 adjacent to the second light-transmitting opening 1132.

Figure 5:
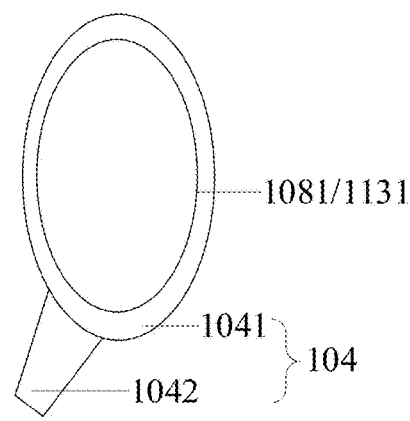
FIG. 5 is a schematic plan view of a first light-transmitting opening and a first electrode layer corresponding to a sub-pixel in a display substrate provided by at least one embodiment of the present disclosure.

For example, FIG. 5 shows a schematic plan view of one first light-transmitting opening 1131, one sub-pixel opening 1081, and one first electrode layer 104 corresponding to one sub-pixel. As shown in FIG. 1, FIG. 2A and FIG. 5, the first electrode layer 104 includes a main body portion 1041 and a connection portion 1042, the connection portion 1042 is configured to be electrically connected to the pixel driving circuit, and the orthographic projection of the sub-pixel opening 1081 on the base substrate 101 is located inside the orthographic projection of the main body portion 1041 on the base substrate 101, so that the sub-pixel opening 1081 can sufficiently expose the main body portion 1041 of the first electrode layer 104.

For example, the first light-transmitting opening 1131, the sub-pixel opening 1081, and the main body portion 1041 of the first electrode layer 104 have an arc-shaped edge, respectively. For example, in the direction parallel to the surface of the base substrate 101, the plane shapes of the first light-transmitting opening 1131, the sub-pixel opening 1081, and the main body portion 1041 of the first electrode layer 104 are substantially elliptical (or mango-shaped), semi-elliptical, circular, semi-circular, racetrack-shaped, semi-racetrack-shaped, or a deformed shape thereof.

The first light-transmitting opening 1131 with an arc-shaped edge can reduce or even eliminate the phenomenon that the external light diffracts at the edge of the first light-transmitting opening of the black matrix layer to cause color separation of the display substrate, thereby improving the display effect of the display substrate. Setting the shapes of the sub-pixel opening 1081 and the main body portion 1041 of the first electrode layer 104 to the same shape as the first light-transmitting opening 1131 enables the display substrate to make full use of the light emitted from the light-emitting device of the sub-pixel for display and to make full use of the electrical signal provided by the first electrode layer 104 to improve the light extraction rate of the display substrate and save power consumption.

For example, in some embodiments, as shown in FIG. 2A and FIG. 2B, the display substrate may further include a spacer 107 provided on the pixel definition layer 108, an encapsulation layer EN provided on the light-emitting device EM of the sub-pixel, and the like. For example, the encapsulation layer EN includes a plurality of sub-encapsulation layers to improve its encapsulation effect. For example, the encapsulation layer EN is a composite encapsulation layer, including a first inorganic encapsulation layer 110, a second organic encapsulation layer 111, and a third inorganic encapsulation layer 112. For example, the first inorganic encapsulation layer 110 and the third inorganic encapsulation layer 112 are formed of inorganic materials such as silicon nitride, silicon oxide, silicon oxynitride, or the like, and the second organic encapsulation layer 111 is formed of organic materials such as polyimide (PI), epoxy resin, or the like. The composite encapsulation layer can form multiple protections for the functional structures on the display substrate, and has better encapsulation effect.

Figure 6:
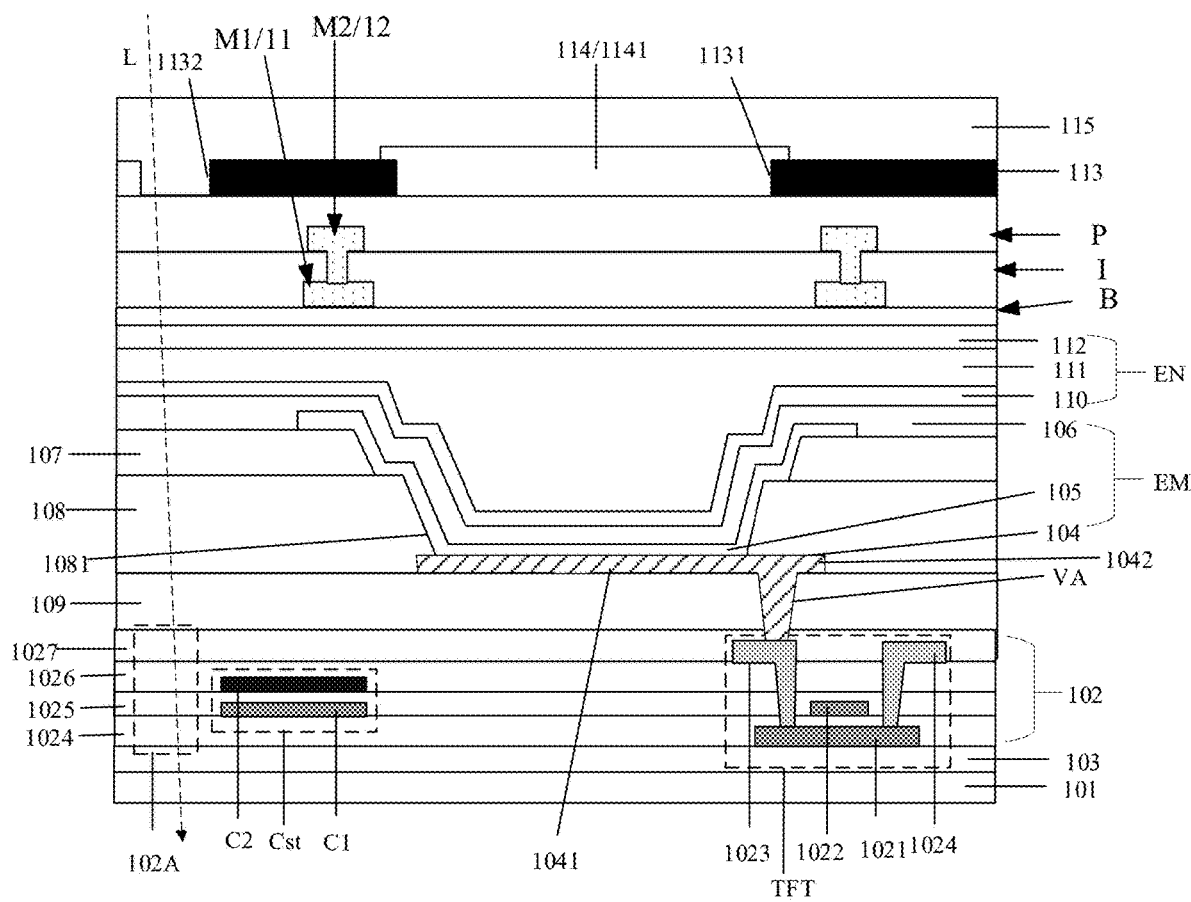
FIG. 6 is further another schematic cross-sectional view of a display substrate provided by at least one embodiment of the present disclosure.

For example, in some embodiments, as shown in FIG. 6, the display substrate may further include a touch control structure provided between the light-emitting device layer and the black matrix layer 113, and the touch control structure at least partially overlaps with the connection portions of the first electrode layers of the light-emitting devices in at least part of the plurality of sub-pixels. The touch control structure may be any type of touch control structure such as a self-capacitive touch control structure or a mutual capacitive touch control structure. For example, the self-capacitive touch control structure or the mutual capacitive touch control structure includes at least one conductive layer. The embodiments of the present disclosure do not limit the specific type and structure of the touch control structure.

Figure 7A:
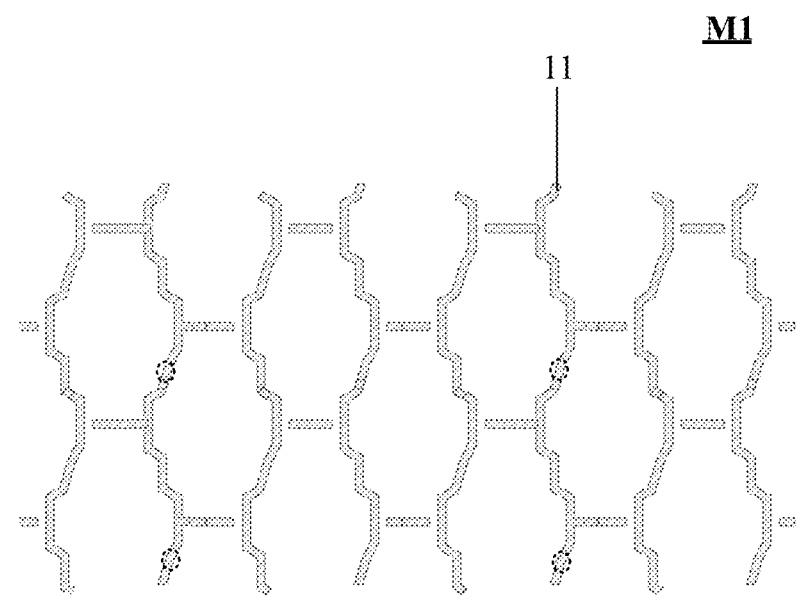
FIG. 7A is a schematic plan view of a first conductive layer of a touch control structure in a display substrate provided by at least one embodiment of the present disclosure.

For example, in some embodiments, as shown in FIG. 6, the touch control structure includes a first conductive layer M1. For example, the touch control structure may further include a substrate B, and the first conductive layer M1 is provided on the substrate B, and is connected to the encapsulation layer EN through the substrate B. For example, FIG. 7A shows a schematic plan view of the first conductive layer M1. As shown in FIG. 7A, the first conductive layer M1 includes a first pattern formed by a plurality of first lines 11.

Figure 7B:
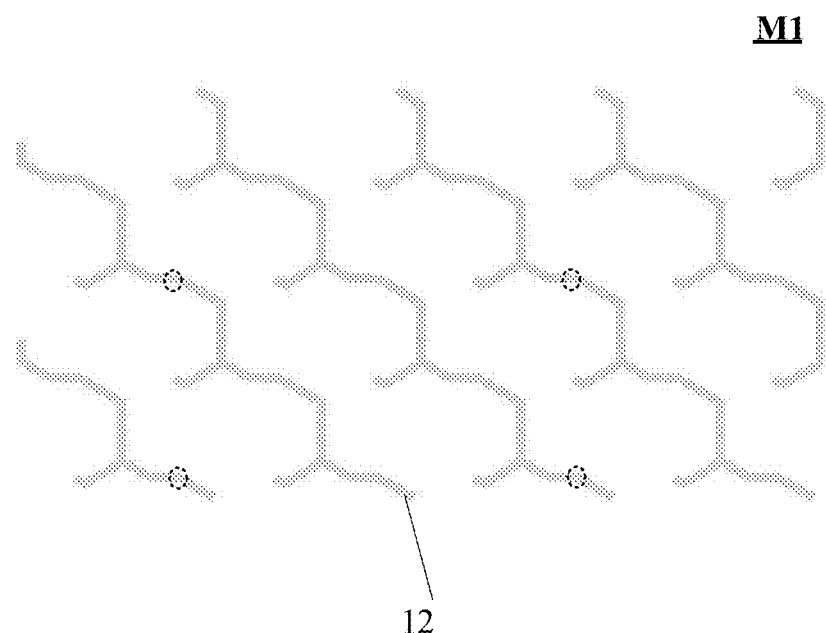
FIG. 7B is a schematic plan view of a second conductive layer of a touch control structure in a display substrate provided by at least one embodiment of the present disclosure.

For example, as shown in FIG. 6, the touch control structure further includes a second conductive layer M2 provided on a side of the first conductive layer M1 away from the base substrate 101, and FIG. 7B shows a schematic plan view of the second conductive layer M2, as shown in FIG. 7B, the second conductive layer M2 includes a second pattern formed by a plurality of second lines 12.

Figure 8:
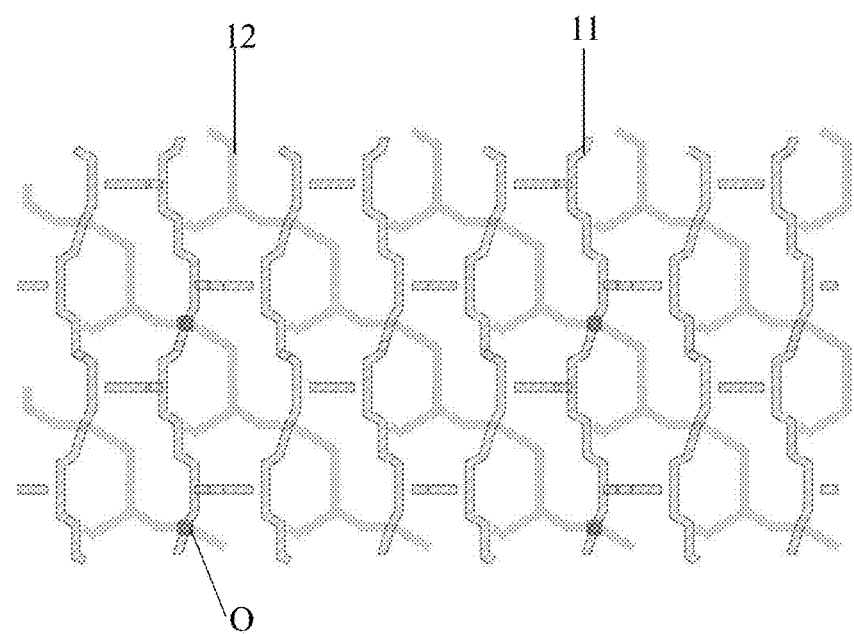
FIG. 8 is a schematic plan view of a stacked layer, in which a first conductive layer and a second conductive layer are stacked, of a touch control structure in a display substrate provided by at least one embodiment of the present disclosure.

For example, as shown in FIG. 6, there is an insulating layer I between the first conductive layer M1 and the second conductive layer M2. As shown in FIG. 7A, the dotted circle portions of the plurality of first lines 11 are configured to be electrically connected to the plurality of second lines 12, for example, electrically connected to the plurality of second lines 12 through vias in the insulating layer I. As shown in FIG. 7B, the dotted circle portions of the plurality of second lines 12 are configured to be electrically connected to the plurality of first lines 11, for example, electrically connected to the plurality of first lines 11 through the vias in the insulating layer I. For example, FIG. 8 shows a schematic diagram of the plurality of first lines 11 and the plurality of second lines 12 being stacked and electrically connected to each other, four electrical connection points O are shown in FIG. 8, and correspondingly, the insulating layer I has vias at the positions of the four electrical connection points O.

In this case, the plurality of first lines 11 and the plurality of second lines 12 are overlapped with each other in a "dotted" manner, and have a small overlapping area, so no parasitic capacitance is generated between the plurality of first lines 11 and the plurality of second lines 12 or the generated parasitic capacitance is so small that it can be ignored, which can improve the touch precision and touch sensitivity of the touch control structure, and thus improve the touch effect and the user experience.

Figure 9A:
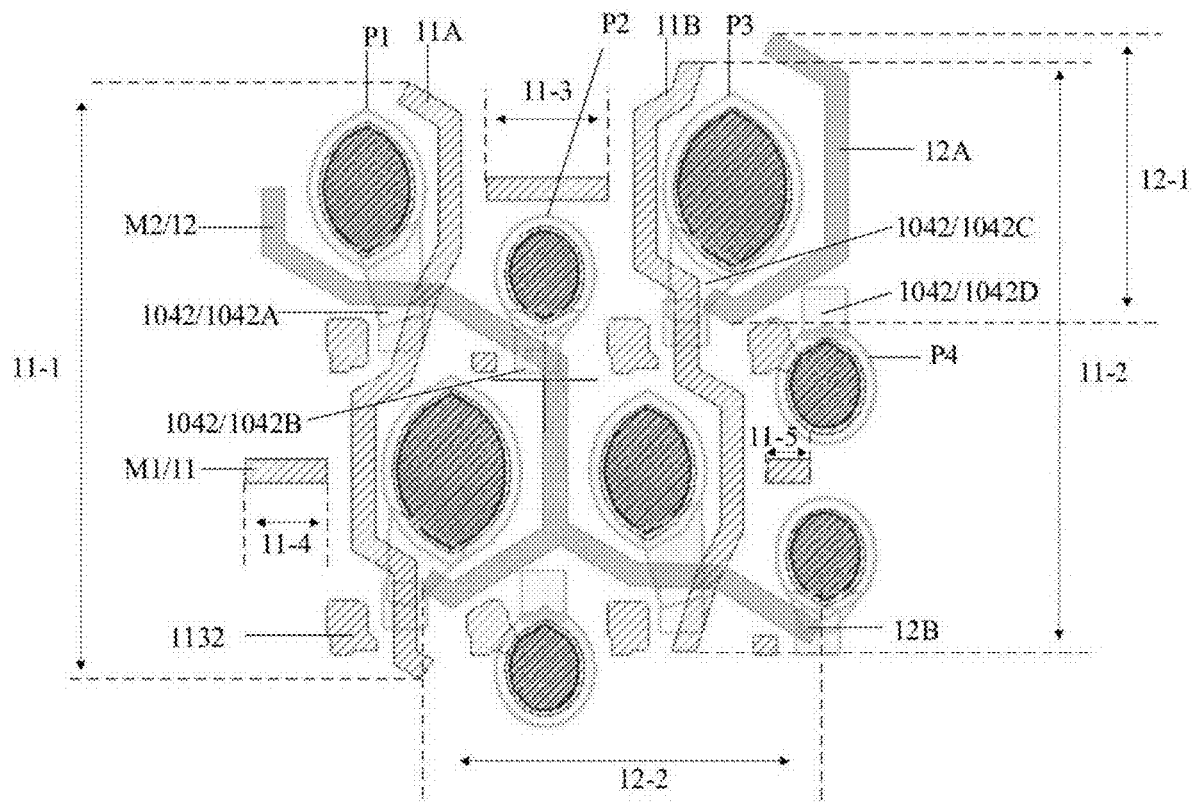
FIG. 9A is a schematic plan view of a stacked layer, in which a touch control structure and a black matrix layer are stacked, in a display substrate provided by at least one embodiment of the present disclosure.

For example, FIG. 9A shows a schematic plan view of a stacked layer, in which the first conductive layer M1, the second conductive layer M2, and the plurality of sub-pixels are stacked. As shown in FIG. 9A, in the direction perpendicular to the surface of the base substrate 101, the first pattern of the first conductive layer M1 at least partially overlaps with the connection portions 1042 of the first electrode layers 104 of the light-emitting devices in at least part of the plurality of sub-pixels, and the second pattern of the second conductive layer M2 at least partially overlaps with the connection portions 1042 of the first electrode layers 104 of the light-emitting devices in at least part of the plurality of sub-pixels.

For example, in some embodiments, as shown in FIG. 9A, in the direction perpendicular to the surface of the base substrate 101, the first pattern of the first conductive layer M1 at least partially overlaps with the connection portion 1042A of the first electrode layer 104 of the light-emitting device of the first sub-pixel P1 (e.g., the red sub-pixel), and at least partially overlaps with the connection portion 1042C of the first electrode layer 104 of the light-emitting device of the third sub-pixel P3 (e.g., the blue sub-pixel).

For example, in some embodiments, as shown in FIG. 9A, in the direction perpendicular to the surface of the base substrate 101, the second pattern of the second conductive layer M2 at least partially overlaps with the connection portion 1042A of the first electrode layer 104 of the light-emitting device of the first sub-pixel P1 (e.g., the red sub-pixel), at least partially overlaps with the connection portion 1042B of the first electrode layer 104 of the light-emitting device of the second sub-pixel P2 (e.g., the green sub-pixel), and at least partially overlaps with the connection portion 1042C of the first electrode layer 104 of the light-emitting device of the third sub-pixel P3 (e.g., the blue sub-pixel).

For example, as shown in FIG. 9A, neither the first pattern of the first conductive layer M1 nor the second pattern of the second conductive layer M2 overlaps with the connection portion 1042D of the first electrode layer 104 of the light-emitting device of the fourth sub-pixel P4 (e.g., the green sub-pixel).

For example, in some embodiments, as shown in FIG. 9A, in the direction perpendicular to the surface of the base substrate 101, the first pattern of the first conductive layer M1 and the second pattern of the second conductive layer M2 do not overlap with the plurality of the second light-transmitting openings 1132. For example, the minimum distance between the first pattern of the first conductive layer M1 as well as the second pattern of the second conductive layer M2 and the plurality of second light-transmitting openings 1132 is greater than 2 μm to prevent the plurality of second light-transmitting openings 1132 from exposing the first pattern of the first conductive layer M1 and the second pattern of the second conductive layer M2. For example, in some examples, the minimum distance between the first pattern of the first conductive layer M1 as well as the second pattern of the second conductive layer M2 and the plurality of second light-transmitting openings 1132 ranges from 2 μm to 5 μm, such as 2.5 μm, 3 μm, 4 μm, or the like.

Figure 9B:
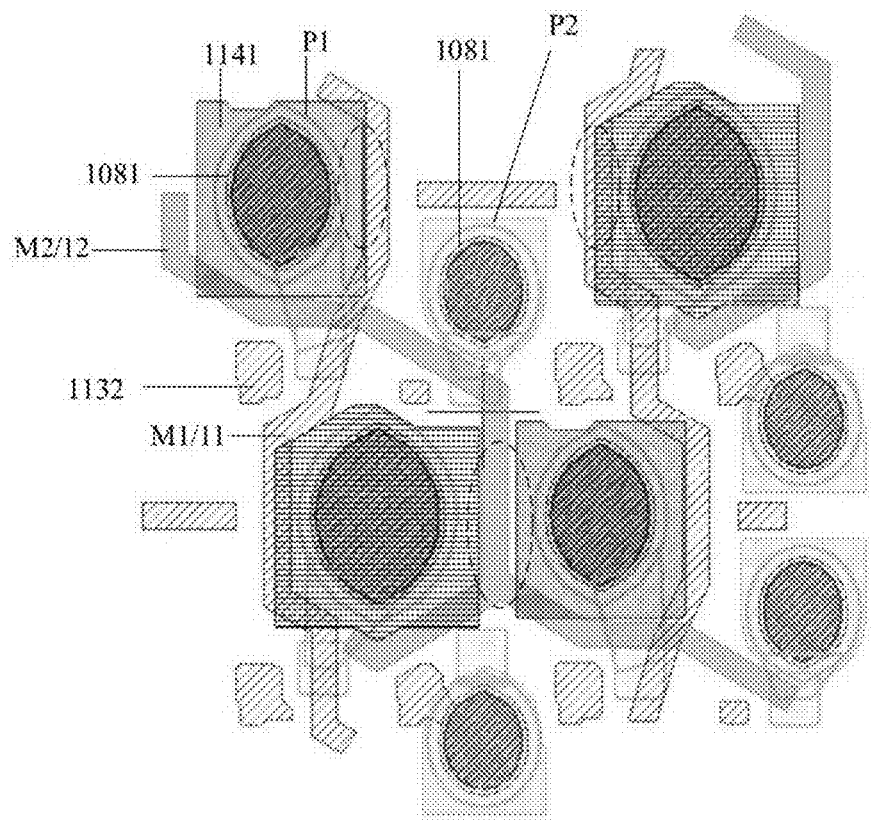
FIG. 9B is a schematic plan view of a stacked layer, in which a plurality of color film patterns, a first pattern, and a second pattern are stacked, in a display substrate provided by at least one embodiment of the present disclosure.

For example, in some embodiments, FIG. 9B shows a schematic plan view of a stacked layer, in which the plurality of color film patterns, the first pattern, and the second pattern are stacked. As shown in FIG. 9B, in the direction perpendicular to the surface of the base substrate, at least part of the plurality of color film patterns 1141 partially overlap with the first pattern and the second pattern.

For example, in some embodiments, as shown in FIG. 9B, edges of at least part of the plurality of color film patterns 1141 are parallel to part lines among the plurality of first lines 11 and the plurality of second lines 12. For example, in each part shown by the dotted circle in the figure, part edges of the color filter patterns 1141 are parallel to part lines among the plurality of first lines 11 and the plurality of second lines 12.

For example, in some embodiments, as shown in FIG. 9B, in the direction parallel to the surface of the base substrate, the area of the sub-pixel opening 1081 corresponding to the first sub-pixel P1 is larger than the area of the sub-pixel opening 1081 corresponding to the second sub-pixel P2, and in the direction perpendicular to the surface of the base substrate, the overlapping area of the first color film pattern 1141 corresponding to the first sub-pixel P1 overlapping with the first pattern and the second pattern is larger than the overlapping area of the second color film pattern 1141 corresponding to the second sub-pixel P2 overlapping with the first pattern and the second pattern. That is, the larger the sub-pixel opening 1081, the larger the overlapping area of the color filter pattern corresponding to the sub-pixel including the sub-pixel opening 1081 overlapping with the first pattern and the second pattern.

For example, in some embodiments, the line width (i.e., the size perpendicular to the extending direction of the line) of the first line 11 ranges from 2 μm to 5 μm, such as 2.5 μm, 3 μm, 4 μm, or the like. The line width of the second line 12 ranges from 2 μm to 5 μm, such as 2.5 μm, 3 μm, 4 μm, or the like. The line width of the first line 11 and the line width of the second line 12 may be the same or different.

For example, as shown in FIG. 9A, the vertical length 11-1 of a first portion 11A, passing through the first sub-pixel P1 and the third sub-pixel P3 in the longitudinal direction, of the first line 11 ranges from 110 μm to 125 μm, such as 117 μm, 120 μm, 122 μm, or the like; the vertical length 11-2 of a second portion 11B, passing through the third sub-pixel P3 and the first sub-pixel P1 in the longitudinal direction, of the first line 11 ranges from 110 μm to 120 μm, such as 114 μm, 115 μm, 116 μm, or the like; the length 11-3 of a laterally extending portion of the first line 11 between the first portion 11A and the second portion 11B ranges from 15 μm to 25 μm, such as 18 μm, 20 μm, 22 μm, or the like; the length 11-4 of a laterally extending portion of the first line 11 on the left side of the first portion 11A ranges from 15 μm to 20 μm, such as 16 μm, 17 μm, 18 μm, or the like; and the length 11-5 of a laterally extending portion of the first line 11 on the right side of the second portion 11B ranges from 5 μm to 10 μm, such as 7 μm, 8 μm, 9 μm, or the like.

For example, as shown in FIG. 9A, the vertical length 12-1 of a first portion 12A, passing through the third sub-pixel P3 in the longitudinal direction, of the second line 12 ranges from 50 μm to 60 μm, such as 55 μm, 57 μm, 59 μm, or the like; and the horizontal length 12-2 of a second portion 12B, passing through the third sub-pixel P3, the first sub-pixel P1, and the second sub-pixel P2 in a lateral direction, of the second line 12 ranges from 75 μm to 85 μm, such as 77 μm, 78 μm, 79 μm, or the like.

Figure 10A:
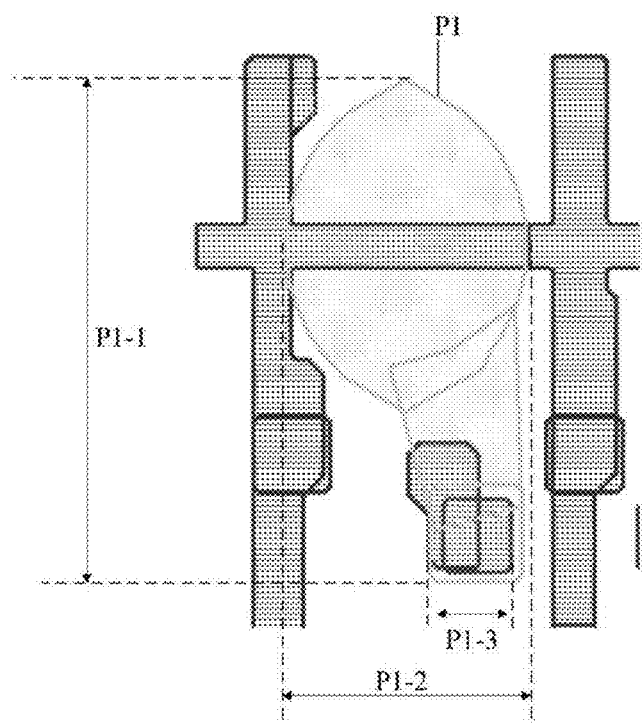
FIG. 10A is a schematic plan view of a first sub-pixel in a display substrate provided by at least one embodiment of the present disclosure.
Figure 10B:
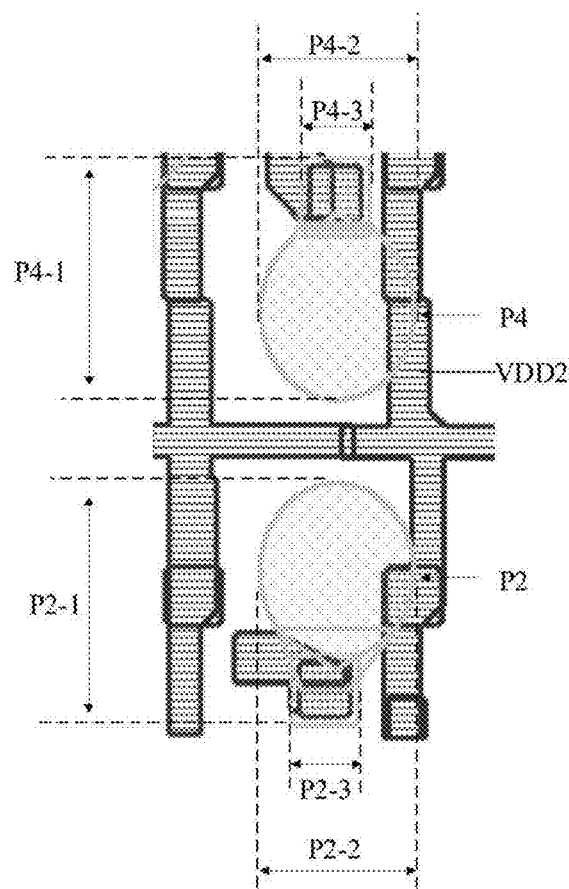
FIG. 10B is a schematic plan view of a second sub-pixel and a fourth sub-pixel in a display substrate provided by at least one embodiment of the present disclosure.
Figure 10C:
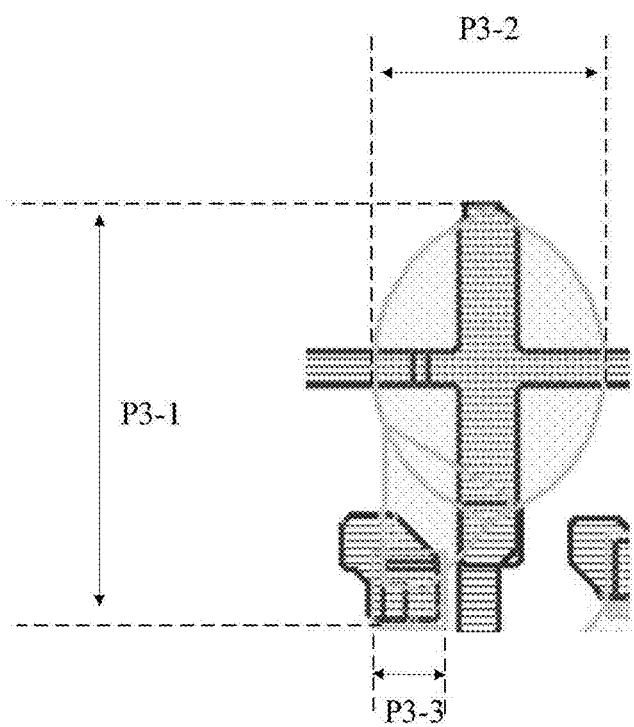
FIG. 10C is a schematic plan view of a third sub-pixel in a display substrate provided by at least one embodiment of the present disclosure.

For example, FIG. 10A to FIG. 10C respectively show schematic plan views of the first electrode layers of the first sub-pixel P1, the second sub-pixel P2, the third sub-pixel P3, and the fourth sub-pixel P4.

For example, in some embodiments, as shown in FIG. 10A, the length P1-1 of the first electrode layer of the first sub-pixel P1 (e.g., the red sub-pixel) in the vertical direction in the figure ranges from 40 μm to 50 μm, such as 43 μm, 45 μm, 47 μm, or the like; the width P1-2 of the first electrode layer of the first sub-pixel P1 in the horizontal direction in the figure ranges from 20 μm to 25 μm, such as 22 μm, 23 μm, 24 μm, or the like; and the width P1-3 of the connection portion of the first electrode layer in the horizontal direction in the figure ranges from 6 μm to 10 μm, such as 7 μm, 8 μm, 9 μm, or the like.

For example, in some embodiments, as shown in FIG. 10B, the length P2-1 of the first electrode layer of the second sub-pixel P2 (e.g., the green sub-pixel) in the vertical direction in the figure ranges from 25 μm to 35 μm, such as 28 μm, 30 μm, 31 μm, or the like; the width P2-2 of the first electrode layer of the second sub-pixel P2 in the horizontal direction in the figure ranges from 17 μm to 22 μm, such as 18 μm, 19 μm, 20 μm, or the like; and the width P2-3 of the connection portion of the first electrode layer in the horizontal direction in the figure ranges from 6 μm to 10 μm, such as 7 μm, 8 μm, 9 μm, or the like.

For example, as shown in FIG. 10B, the shapes and sizes of the first electrode layer of the fourth sub-pixel P4 (e.g., the green sub-pixel) and the first electrode layer of the second sub-pixel P2 (e.g., the green sub-pixel) are substantially the same. For example, the length P4-1 of the first electrode layer of the fourth sub-pixel P4 (e.g., the green sub-pixel) in the vertical direction in the figure ranges from 25 μm to 35 μm, such as 28 μm, 30 μm, 31 μm, or the like; the width P4-2 of the first electrode layer of the fourth sub-pixel P4 in the horizontal direction in the figure ranges from 17 μm to 22 μm, such as 18 μm, 19 μm, 20 μm, or the like; and the width P4-3 of the connection portion of the first electrode layer in the horizontal direction in the figure ranges from 6 μm to 10 μm, such as 7 μm, 8 μm, 9 μm, or the like.

For example, in some embodiments, as shown in FIG. 10C, the length P3-1 of the first electrode layer of the third sub-pixel P3 (e.g., the blue sub-pixel) in the vertical direction in the figure ranges from 45 μm to 55 μm, such as 48 μm, 49 μm, 50 μm, or the like; the width P3-2 of the first electrode layer of the third sub-pixel P3 in the horizontal direction in the figure ranges from 25 μm to 30 μm, such as 27 μm, 28 μm, 29 μm, or the like; and the width P3-3 of the connection portion of the first electrode layer in the horizontal direction in the figure ranges from 6 μm to 10 μm, such as 7 μm, 8 μm, 9 μm, or the like.

Hereinafter, the structure and circuit arrangement of each functional layer of the display substrate provided by the embodiments of the present disclosure will be described in detail through a specific example. In this example, the sub-pixel uses a 7T1C pixel driving circuit to drive the light-emitting device EM.

Figure 11A:
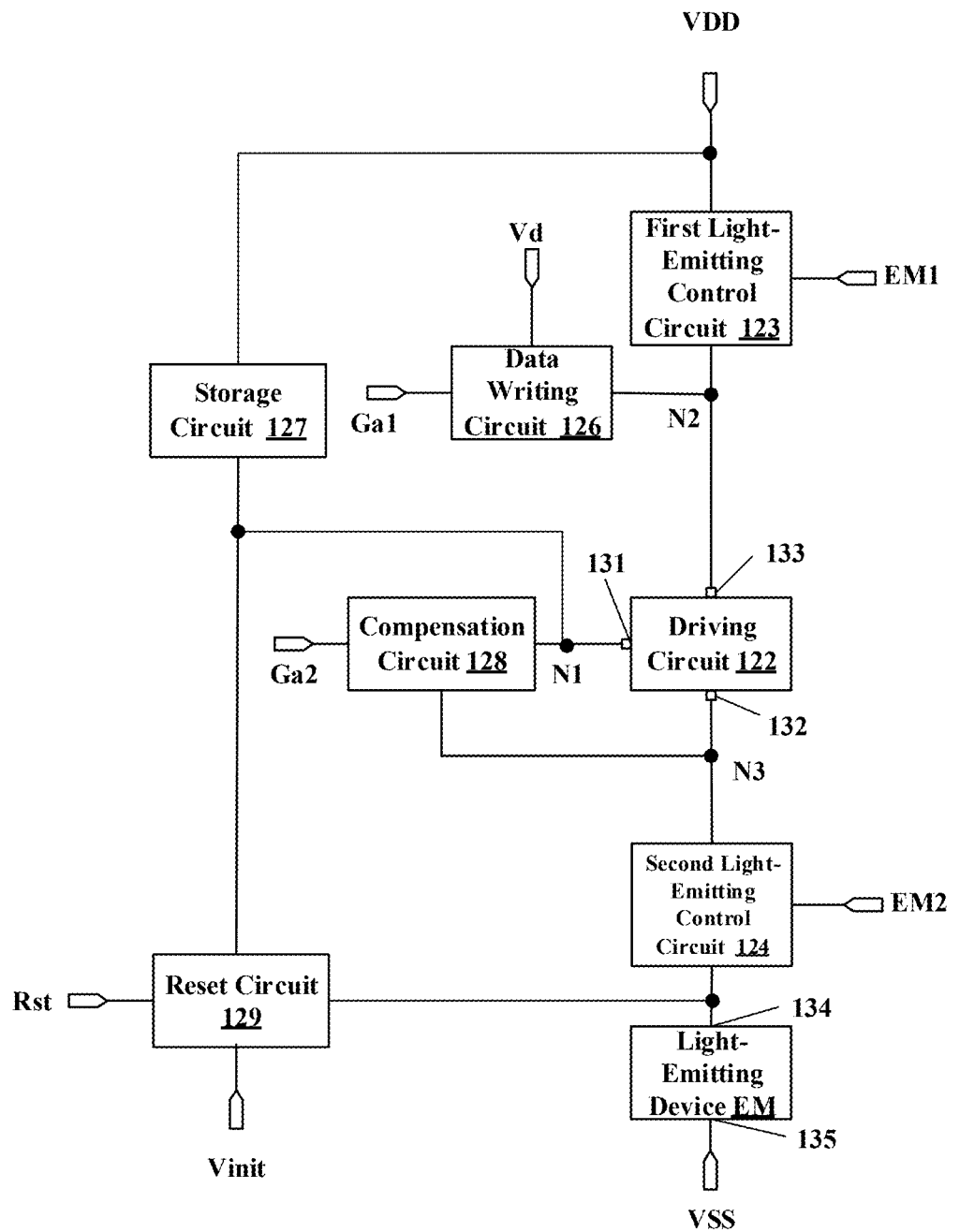
FIG. 11A is a schematic plan view of a pixel driving circuit in a display substrate provided by at least one embodiment of the present disclosure.

For example, FIG. 11A shows a circuit diagram of a 7T1C pixel circuit. As shown in FIG. 11A, the pixel circuit includes a driving circuit 122, a data writing circuit 126, a compensation circuit 128, a storage circuit 127, a first light-emitting control circuit 123, a second light-emitting control circuit 124, and a reset circuit 129.

For example, the driving circuit 122 includes a control terminal 131, a first terminal 132, and a second terminal 133, and the driving circuit 122 is configured to control a driving current flowing through the light-emitting device EM. The control terminal 131 of the driving circuit 122 is connected to a first node N1, the first terminal 132 the driving circuit 122 is connected to a second node N2, and the second terminal 133 of the driving circuit 122 is connected to a third node N3.

For example, the data writing circuit 126 includes a control terminal, a first terminal, and a second terminal. The control terminal is configured to receive a first scan signal, the first terminal is configured to receive a data signal, and the second terminal is connected to the first terminal 132 (the second node N2) of the driving circuit 122, and is configured to write the data signal to the first terminal 132 of the driving circuit 122 in response to the first scan signal Ga1. For example, the first terminal of the data writing circuit 126 is connected to a data line 12 to receive the data signal, and the control terminal is connected to a scan line 11 to receive the first scan signal Ga1.

For example, during a data writing stage, the data writing circuit 126 is turned on in response to the first scan signal Ga1, so that the data signal is written to the first terminal 132 (the second node N2) of the driving circuit 122, and the data signal is stored in the storage circuit 127, so that the driving current for driving the light-emitting device EM to emit light is generated according to the data signal during, for example, a light-emitting stage.

For example, the compensation circuit 128 includes a control terminal, a first terminal, and a second terminal. The control terminal of the compensation circuit 128 is configured to receive a second scan signal Ga2, the first terminal and the second terminal of the compensation circuit 128 are electrically connected to the control terminal 131 and the second terminal 133 of the driving circuit 122, respectively, and the compensation circuit 128 is configured to perform threshold compensation on the driving circuit 120 in response to the second scan signal.

For example, the storage circuit 127 is electrically connected to the control terminal 131 of the driving circuit 122 and a first voltage terminal VDD, and is configured to store the data signal written by the data writing circuit 126. For example, during a data writing and compensation stage, the compensation circuit 128 is turned on in response to the second scan signal Ga2, so that the data signal written by the data writing circuit 126 is stored in the storage circuit 127. For example, still during the data writing and compensation stage, the compensation circuit 128 electrically connects the control terminal 131 and the second terminal 133 of the driving circuit 122, so that the relevant information of the threshold voltage of the driving circuit 122 is also correspondingly stored in the storage circuit, so that the stored data signal and the threshold voltage can be used to control the driving circuit 122 during, for example, the light-emitting stage, so that the output of the driving circuit 122 is compensated.

For example, the first light-emitting control circuit 123 is connected to the first terminal 132 (the second node N2) of the driving circuit 122 and the first voltage terminal VDD, and is configured to apply a first power supply voltage of the first voltage terminal VDD to the first terminal 132 of the driving circuit 122 in response to a first light-emitting control signal. For example, as shown in FIG. 11A, the first light-emitting control circuit 123 is connected to a first light-emitting control terminal EM1, the first voltage terminal VDD, and the second node N2.

For example, the second light-emitting control circuit 124 is connected to a second light-emitting control terminal EM2, a first terminal 134 of the light-emitting device EM, and the second terminal 132 of the driving circuit 122, and is configured to enable the driving current to be applied to the light-emitting device EM in response to a second light-emitting control signal.

For example, during the light-emitting stage, the second light-emitting control circuit 123 is turned on in response to the second light-emitting control signal provided by the second light-emitting control terminal EM2, so that the driving circuit 122 can apply the driving current to the light-emitting device EM to make it emit light through the second light-emitting control circuit 123; while during the non-light-emitting stage, the second light-emitting control circuit 123 is turned off in response to the second light-emitting control signal, so as to avoid current flowing through the light-emitting device EM to make it emit light, which can improve the contrast of the corresponding display device.

For another example, during an initialization stage, the second light-emitting control circuit 124 is also turned on in response to the second light-emitting control signal, so that the reset circuit is combined to perform a reset operation on the driving circuit 122 and the light-emitting device EM.

For example, the second light-emitting control signal EM2 is the same as or different from the first light-emitting control signal EM1. For example, the second light-emitting control signal EM2 and the first light-emitting control signal EM1 are connected to the same signal output terminal or different signal output terminals.

For example, the reset circuit 129 is connected to a reset voltage terminal Vinit and the first terminal 134 (a fourth node N4) of the light-emitting device EM, and is configured to apply a reset voltage to the first terminal 134 of the light-emitting device EM in response to a reset signal. In other examples, as shown in FIG. 11A, the reset signal is also applied to the control terminal 131 of the driving circuit, that is, the first node N1. For example, the reset signal is the second scan signal, and the reset signal may also be other signals synchronized with the second scan signal, which is not limited in the embodiments of the present disclosure. For example, as shown in FIG. 11A, the reset circuit 129 is respectively connected to the first terminal 134 of the light-emitting device EM, the reset voltage terminal Vinit, and a reset control terminal Rst (a reset control line). For example, during the initialization stage, the reset circuit 129 is turned on in response to the reset signal, so that the reset voltage is applied to the first terminal 134 of the light-emitting device EM and the first node N1, so that the reset operation is performed on the driving circuit 122, the compensation circuit 128, and the light-emitting device EM to eliminate the influence of the previous light-emitting stage.

For example, the light-emitting device EM includes the first terminal 134 and a second terminal 135, the first terminal 134 of the light-emitting device EM is configured to receive the driving current from the second terminal 133 of the driving circuit 122, and the second terminal 135 of the light-emitting device EM is configured to be connected to a second voltage terminal VSS. For example, in one example, as shown in FIG. 11A, the first terminal 134 of the light-emitting device EM is connected to a third node N3 through the second light-emitting control circuit 124. The embodiments of the present disclosure include, but are not limited to, this case. For example, the light-emitting device EM includes various types of OLEDs, such as top emission, bottom emission, double-sided emission, etc., which can emit red, green, blue, or white light, etc., and the first electrode layer and the second electrode layer of the OLED respectively serve as the first terminal 134 and the second terminal 135 of the light-emitting device. The embodiments of the present disclosure do not limit the specific structure of the light-emitting device.

It should be noted that, in the description of the embodiments of the present disclosure, the first node N1, the second node N2, the third node N3, and the fourth node N4 do not necessarily represent actual components, but represent the junctions of related circuit connections in the circuit diagram.

It should be noted that, in the description of the embodiments of the present disclosure, the symbol Vd can represent both the data signal terminal and the level of the data signal. Similarly, the symbols Ga1 and Ga2 can represent both the first scan signal and the second scan signal, as well as the first scan signal terminal and the second scan signal terminal; the symbol Rst can represent both the reset control terminal and the reset signal; the symbol Vinit can represent both the reset voltage terminal and the reset voltage; the symbol VDD can represent both the first voltage terminal and the first power supply voltage; and the symbol VSS can represent both the second voltage terminal and the second power supply voltage. The following embodiments are the same and will not be repeated.

Figure 11B:
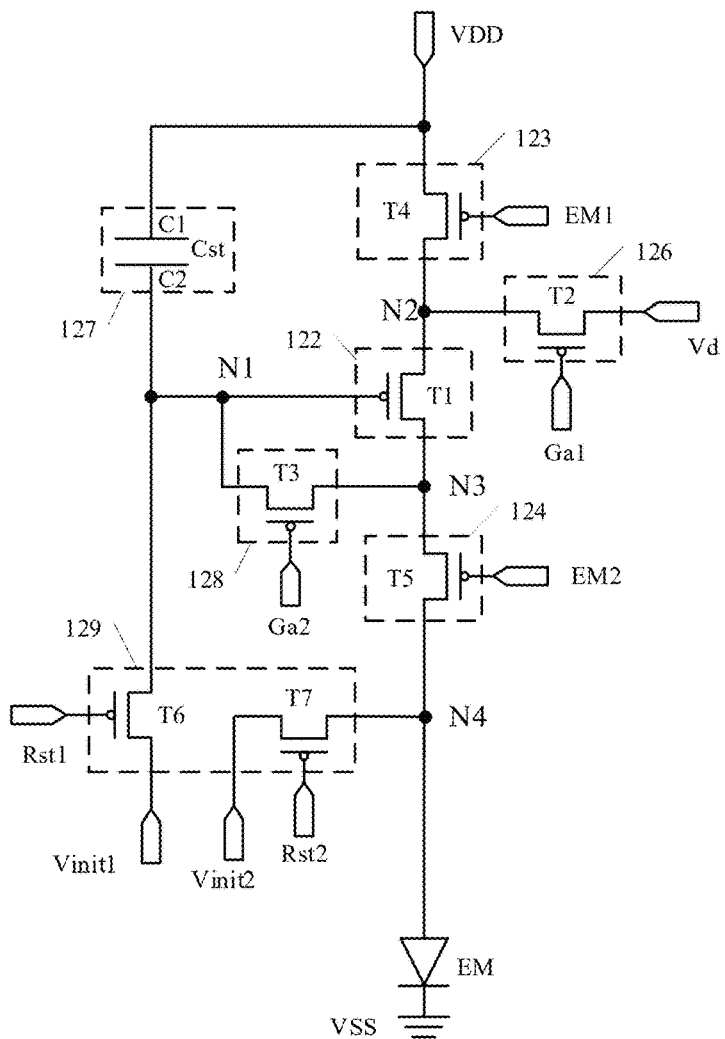
FIG. 11B is a schematic plan view of another pixel driving circuit in a display substrate provided by at least one embodiment of the present disclosure.

FIG. 11B is a circuit diagram of a specific implementation example of the pixel circuit shown in FIG. 11A. As shown in FIG. 11B, the pixel circuit includes first to seventh transistors T1, T2, T3, T4, T5, T6, and T7, and includes a storage capacitor Cst. For example, the first transistor T1 is used as a driving transistor, and the other second to seventh transistors are used as switching transistors.

For example, as shown in FIG. 11B, the driving circuit 122 is implemented as the first transistor T1. A gate electrode of the first transistor T1 serves as the control terminal 131 of the driving circuit 122 and is connected to the first node N1; a first electrode of the first transistor T1 serves as the first terminal 132 of the driving circuit 122 and is connected to the second node N2; and a second electrode of the first transistor T1 serves as the second terminal 133 of the driving circuit 122 and is connected to the third node N3.

For example, as shown in FIG. 11B, the data writing circuit 126 is implemented as the second transistor T2. A gate electrode of the second transistor T2 is connected to a first scan line (the first scan signal terminal Ga1) to receive the first scan signal, a first electrode of the second transistor T2 is connected to a data line (the data signal terminal Vd) to receive the data signal, and a second electrode of the second transistor T2 is connected to the first terminal 132 (the second node N2) of the driving circuit 122. For example, the second transistor T2 is a P-type transistor, for example, a thin film transistor in which the active layer is formed by low temperature doped polysilicon.

For example, as shown in FIG. 11B, the compensation circuit 128 is implemented as the third transistor T3. A gate electrode of the third transistor T3 is configured to be connected to a second scan line (the second scan signal terminal Ga2) to receive the second scan signal, a first electrode of the third transistor T3 is configured to be connected to the control terminal 131 of the driving circuit 122 (the first node N1), and a second electrode of the third transistor T3 is connected to the second terminal 133 (the third node N3) of the driving circuit 122.

For example, as shown in FIG. 11B, the storage circuit 127 is implemented as the storage capacitor Cst, the storage capacitor Cst includes a first capacitor electrode C1 and a second capacitor electrode C2, the first capacitor electrode C1 is connected to the first voltage terminal VDD, and the second capacitor electrode C2 is connected to the control terminal 131 of the driving circuit 122.

For example, as shown in FIG. 11B, the first light-emitting control circuit 123 is implemented as the fourth transistor T4. A gate electrode of the fourth transistor T4 is connected to a first light-emitting control line (the first light-emitting control terminal EM1) to receive the first light-emitting control signal, a first electrode of the fourth transistor T4 is connected to the first voltage terminal VDD to receive the first power supply voltage, and a second electrode of the fourth transistor T4 is connected to the first terminal 132 (the second node N2) of the driving circuit 122.

For example, the light-emitting device EM is implemented as an organic light-emitting diode (OLED), the first electrode layer (here, the anode) of the light-emitting device EM is connected to the fourth node N4 and is configured to receive the driving current from the second terminal 133 of the driving circuit 122 through the second light-emitting control circuit 124, and the second electrode layer (here, the cathode) of the light-emitting device EM is configured to be connected to the second voltage terminal VSS to receive the second power supply voltage. For example, the second voltage terminal is grounded, that is, VSS is 0V.

For example, the second light-emitting control circuit 124 is implemented as the fifth transistor T5. A gate electrode of the fifth transistor T5 is connected to a second light-emitting control line (the second light-emitting control terminal EM2) to receive the second light-emitting control signal, a first electrode of the fifth transistor T5 is connected to the second terminal 133 (the third node 133) of the driving circuit 122, and a second electrode of the fifth transistor T5 is connected to the first terminal 134 (the fourth node N4) of the light-emitting device EM.

For example, the reset circuit 129 includes a first reset circuit and a second reset circuit, the first reset circuit is configured to apply a first reset voltage Vini1 to the first node N1 in response to a first reset signal Rst1, and the second reset circuit is configured to apply a second reset voltage Vini2 to the fourth node N4 in response to a second reset signal Rst2. For example, as shown in FIG. 11B, the first reset circuit is implemented as the sixth transistor T6, and the second reset circuit is implemented as the seventh transistor T7. A gate electrode of the sixth transistor T6 is configured to be connected to a first reset control terminal Rst1 to receive the first reset signal Rst1, a first electrode of the sixth transistor T6 is connected to a first reset voltage terminal Vinit1 to receive the first reset voltage Vinit1, and a second electrode of the six transistors T6 is configured to be connected to the first node N1. A gate electrode of the seventh transistor T7 is configured to be connected to a second reset control terminal Rst2 to receive the second reset signal Rst2, a first electrode of the seventh transistor T7 is connected to a second reset voltage terminal Vinit2 to receive the second reset voltage Vinit2, and a second electrode of the seven transistor T7 is configured to be connected to the fourth node N4.

It should be noted that each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode.

For example, referring to FIG. 1, the first signal line S1 is a light-emitting control line EMT, which is used to transmit the above-mentioned first light-emitting control signal EM1 and the second light-emitting control signal EM2. The second signal line S2 is a reset voltage line VNT, which is used to transmit the above-mentioned first reset voltage Vinit1 and the second reset voltage Vini2. For example, a side of the reset voltage line VNT away from the light-emitting control line EMT further has a reset control line RST for transmitting the above-mentioned first reset signal Rst1 and second reset signal Rst2.

The layout design of the above-mentioned pixel driving circuit will be described in detail below.

Figure 12:
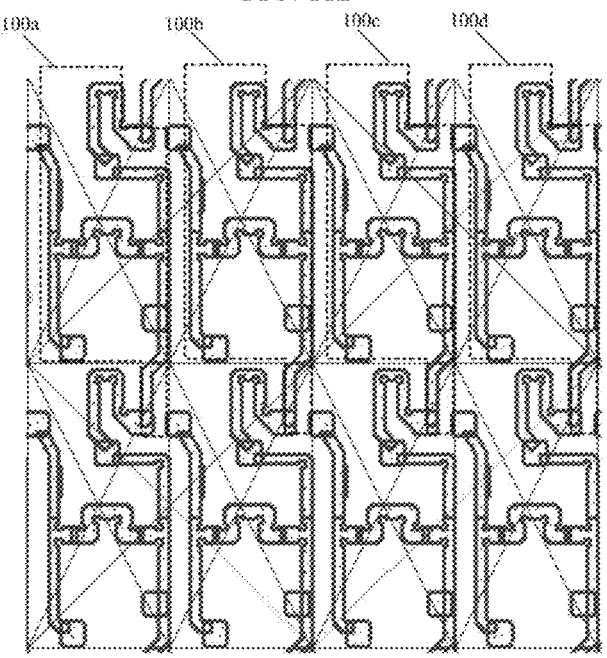
FIG. 12 to FIG. 18B are schematic partial plan views of respective functional layers of a display substrate and schematic partial plan views of the respective functional layers stacked in sequence provided by at least one embodiment of the present disclosure.

For example, FIG. 12 shows a schematic diagram of a semiconductor layer of the display substrate, the semiconductor layer is used to form the active layers of the thin film transistors T1 to T7 of the pixel driving circuits of a plurality of sub-pixels. FIG. 12 shows pixel driving circuits of two rows of sub-pixels, and the following takes the pixel driving circuits of four directly adjacent sub-pixels (i.e., a first sub-pixel 100a, a second sub-pixel 100b, a third sub-pixel 100c, and a fourth sub-pixel 100d) as an example to illustrate. The dotted frame in the figure shows the region where the pixel driving circuit of each sub-pixel is located, and the embodiments of the present disclosure are not limited to this layout.

For example, a first gate insulating layer is further provided on the semiconductor layer, which is not shown in the figure, and reference may be made to the first gate insulating layer 1024 in FIG. 2A or FIG. 6.

Figure 13A:
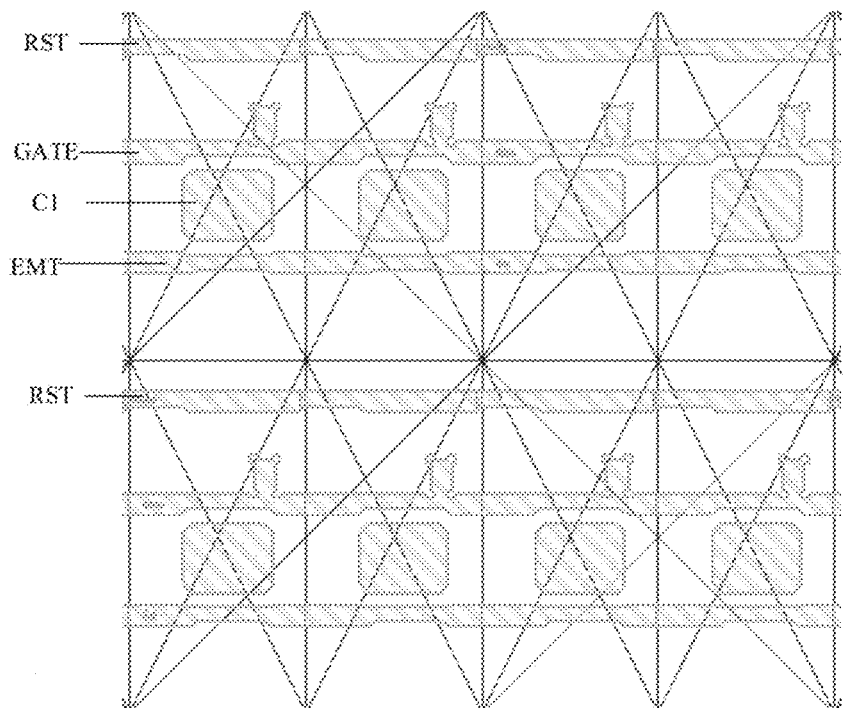
Figure 13B:
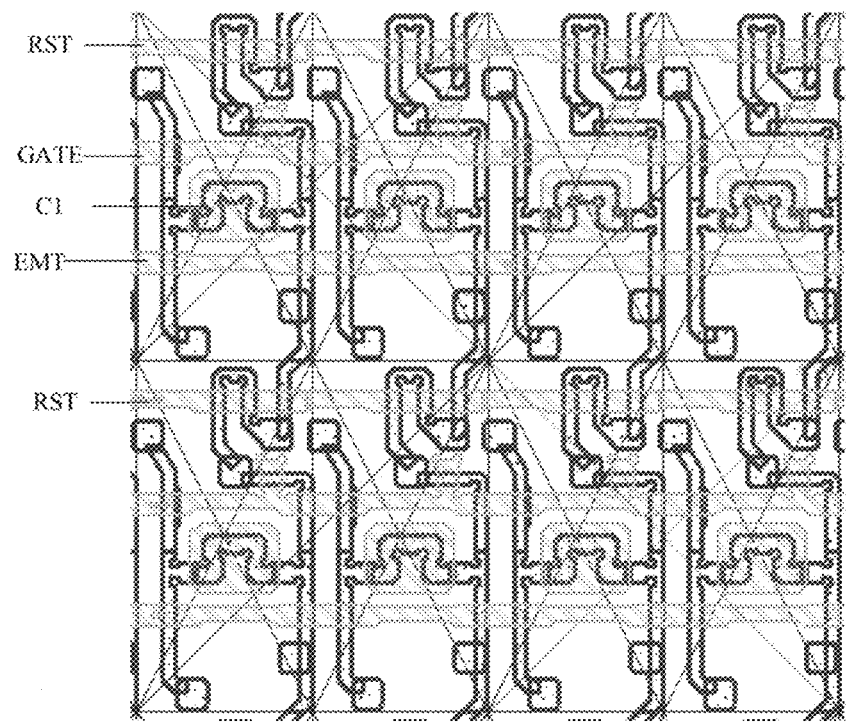

For example, FIG. 13A shows a schematic diagram of a first gate metal layer of the display substrate, the first gate metal layer is provided on the first gate insulating layer, and FIG. 13B shows a schematic diagram of a stacked layer, in which the first gate metal layer and the semiconductor layer are stacked, of the display substrate.

For example, as shown in FIG. 13A and FIG. 13B, the first gate metal layer includes a plurality of light-emitting control lines EMT, a plurality of reset control lines RST, a plurality of scan lines GATE, and the first capacitor electrodes C1 of a plurality of storage capacitors Cst, for example, the portions of the light-emitting control line EMT, the reset control line RST, the scan line GATE, and the first capacitor electrode C1 of the storage capacitor Cst overlapping with the active layers of the thin film transistors T1 to T7 constitute the gate electrodes of the thin film transistors T1 to T7. The plurality of light-emitting control lines EMT, the plurality of reset control lines RST, and the plurality of scan lines GATE are respectively electrically connected to a plurality of rows of sub-pixels in one-to-one correspondence to provide corresponding electrical signals.

For example, a second gate insulating layer is further provided on the first gate metal layer, which is not shown in the figure, and reference may be made to the second gate insulating layer 1025 in FIG. 5.

Figure 14A:
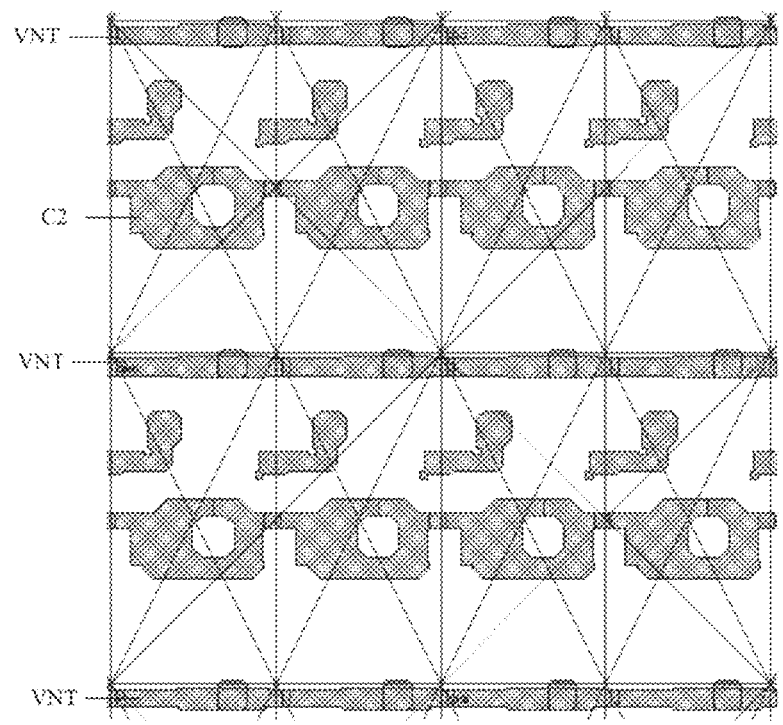
Figure 14B:
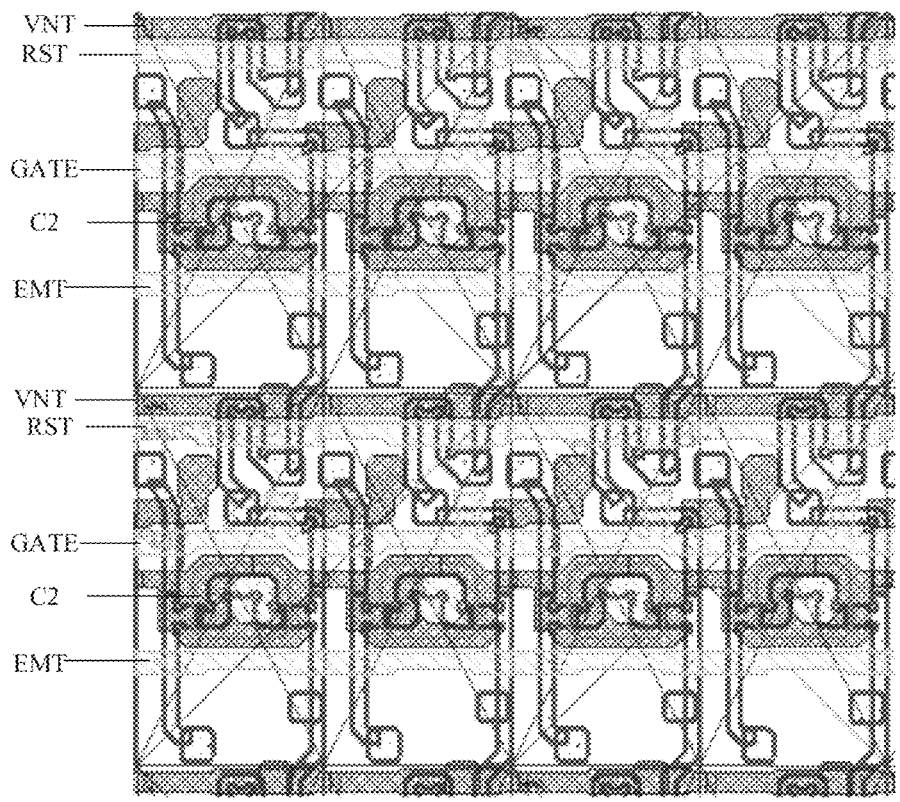

FIG. 14A shows a schematic diagram of a second gate metal layer of the display substrate, the second gate metal layer is provided on the second gate insulating layer, and FIG. 14B shows a schematic diagram of a stacked layer, in which the second gate metal layer, the first gate metal layer, and the semiconductor layer are stacked, of the display substrate.

For example, as shown in FIG. 14A and FIG. 14B, the second gate metal layer includes the second capacitor electrodes C2 of the storage capacitors Cst and a plurality of reset voltage lines VNT. The second capacitor electrode C2 of the storage capacitor Cst at least partially overlaps with the first capacitor electrode C1 to form a capacitor. The plurality of reset voltage lines VNT are electrically connected to the plurality of rows of sub-pixels in one-to-one correspondence to provide corresponding electrical signals.

For example, an interlayer insulating layer is further provided on the second gate metal layer, which is not shown in the figures, and reference may be made to the interlayer insulating layer 1026 in FIG. 2A or FIG. 6.

Figure 15A:
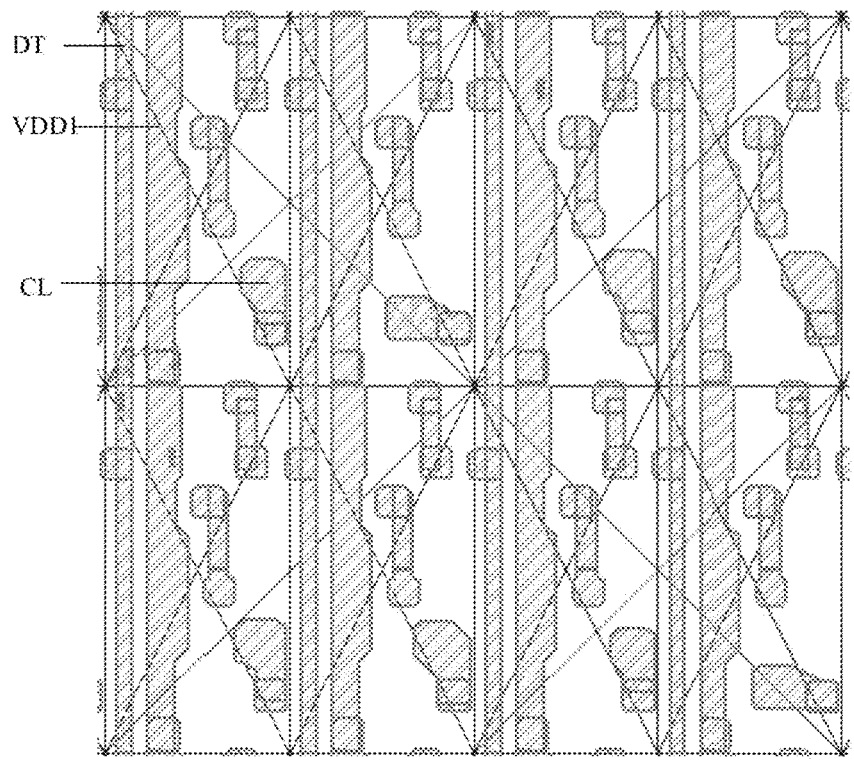
Figure 15B:
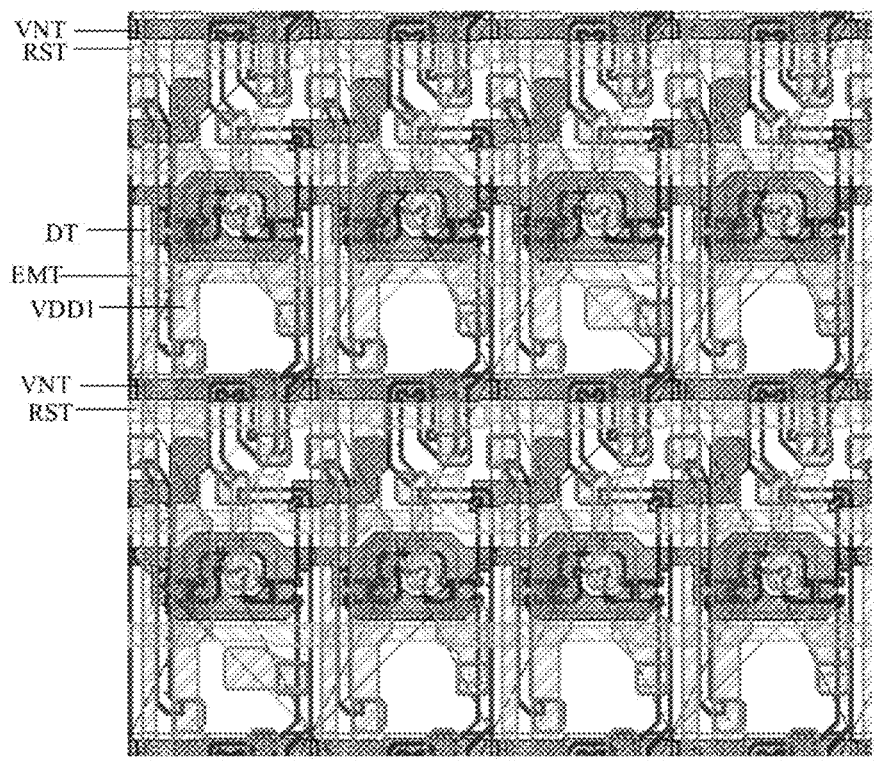

FIG. 15A shows a schematic diagram of a first source-drain metal layer of the display substrate, the first source-drain metal layer is provided on the interlayer insulating layer, and FIG. 15B shows a schematic diagram of a stacked layer, in which the first source-drain metal layer, the second gate metal layer, the first gate metal layer, and the semiconductor layer are stacked, of the display substrate.

As shown in FIG. 15A and FIG. 15B, the first source-drain metal layer includes a plurality of first power supply lines VDD1. For example, the plurality of first power supply lines VDD1 are respectively electrically connected to a plurality of columns of sub-pixels in one-to-one correspondence to provide the first power supply voltage. For example, the first source-drain metal layer further includes a plurality of data lines DT. The plurality of data lines DT are electrically connected to the plurality of columns of sub-pixels in one-to-one correspondence to provide data signals. For example, the first source-drain metal layer further includes a plurality of connection electrodes CL for connecting the second capacitor electrode C2 to the first electrode of the third transistor T3, or connecting the first electrode of the sixth transistor T6 to the reset voltage line VNT, or connecting the second electrode of the fifth transistor T5 to the first electrode layer of the light-emitting device, etc.

For example, a passivation layer and a planarization layer are further provided on the first source-drain metal layer, which are not shown in the figures, and reference may be made to the passivation layer 1027 and the planarization layer 1091 in FIG. 2A or FIG. 6.

Figure 16A:
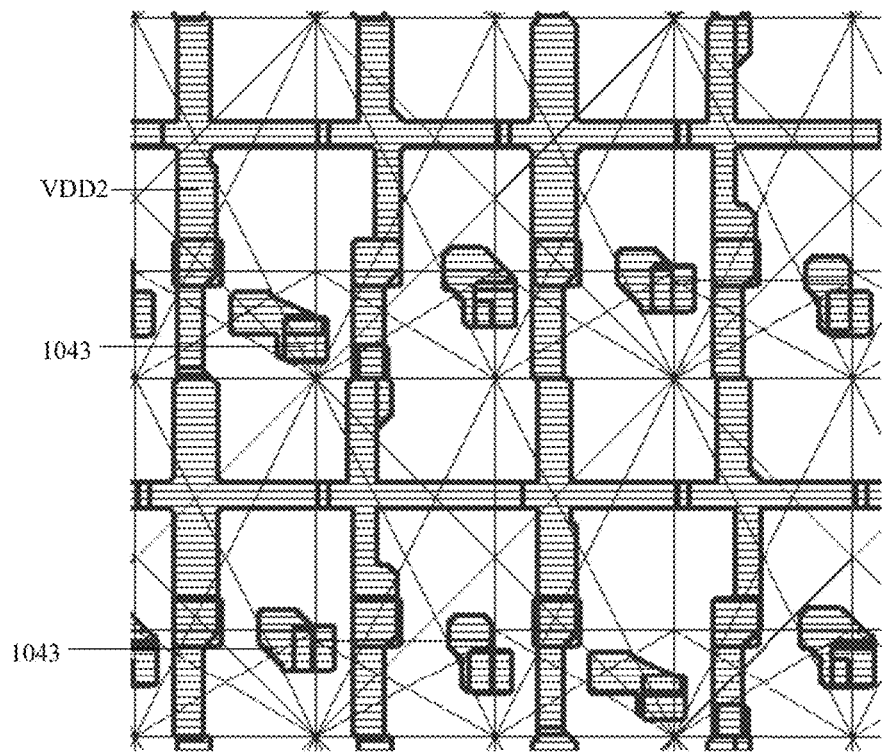
Figure 16B:
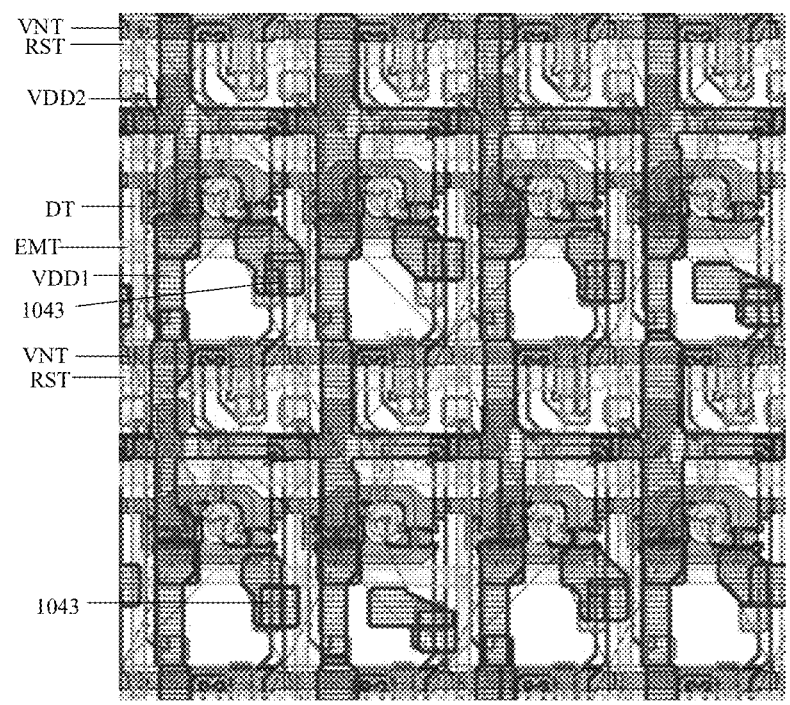

FIG. 16A shows a schematic diagram of a second source-drain metal layer of the display substrate, and the second source-drain metal layer is provided on the planarization layer 1091. FIG. 16B shows a schematic diagram of a stacked layer, in which the second source-drain metal layer, the first source-drain metal layer, the second gate metal layer, the first gate metal layer, and the semiconductor layer are stacked, of the display substrate.

As shown in FIG. 16A and FIG. 16B, the second source-drain metal layer includes a second power supply line VDD2, and the second power supply line VDD2 is in a grid shape. For example, the second power supply line VDD2 is electrically connected to the first power supply line VDD1 to help reduce the resistance on the power supply line, thereby reducing the voltage drop of the power supply line, and helping to uniformly transmit the first power supply voltage to each sub-pixel of the display substrate. For example, the second source-drain metal layer further includes a connection electrode 1043 for connecting the first electrode layer of the light-emitting device to the first electrode of the first transistor T1. For example, referring to FIG. 10B, the second power supply line VDD2 at least partially overlaps with the main body portion 1042 of the first electrode layer 104 in the direction perpendicular to the surface of the base substrate.

Figure 17:
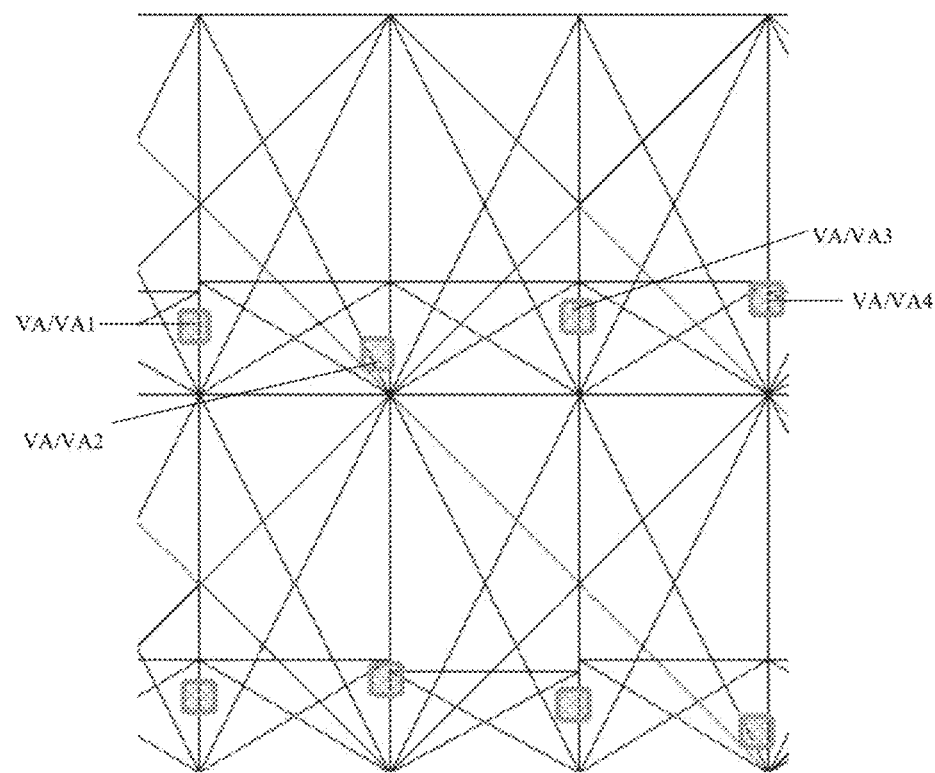

For example, another planarization layer, that is, a planarization layer 109, is further provided on the second source-drain metal layer. FIG. 17 shows a schematic plan view of the planarization layer, and in conjunction with FIG. 2A and FIG. 6, the planarization layer 109 has a plurality of vias VA. In this case, the first electrode layer 104 is connected to the connection electrode 1043 through the via VA in the planarization layer 109.

For example, the plurality of vias VA of the planarization layer 109 corresponding to a plurality of sub-pixels located in the same row are not in a straight line. For example, as shown in FIG. 17, one first sub-pixel (e.g., a red sub-pixel), one second sub-pixel (e.g., a green sub-pixel), one third sub-pixel (e.g., a blue sub-pixel), and one fourth subpixel (e.g., a green sub-pixel) that are adjacent to each other and in the same row respectively correspond to vias VA1 to VA4, and the vias VA1 to VA4 are not arranged in the same straight line.

By designing the plurality of vias VA of the planarization layer 109 not to be in a straight line, the lines of the pixel driving circuit can avoid a larger light-transmitting region, thereby forming a light-transmitting portion with a sufficient area.

Figure 18A:
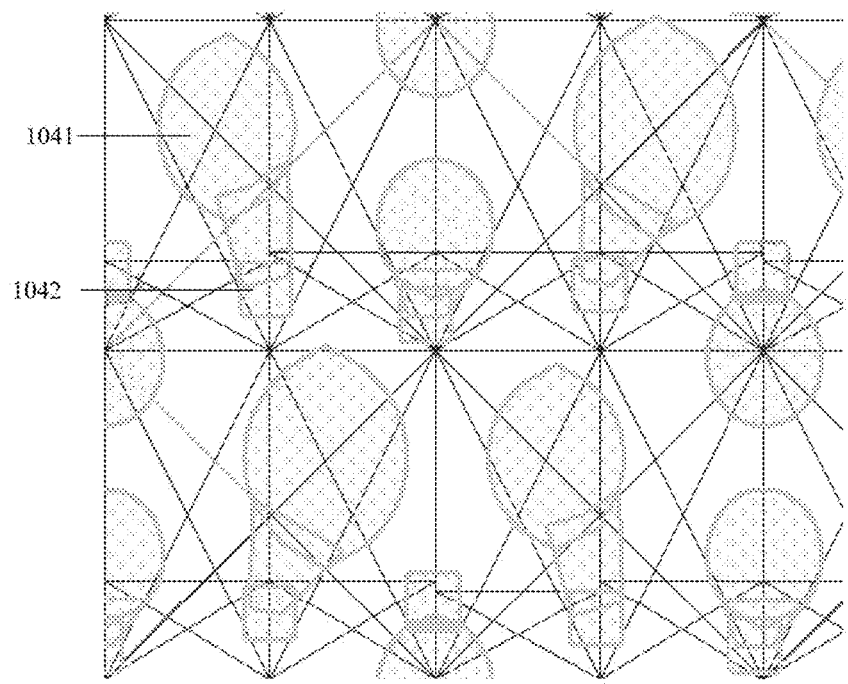
Figure 18B:
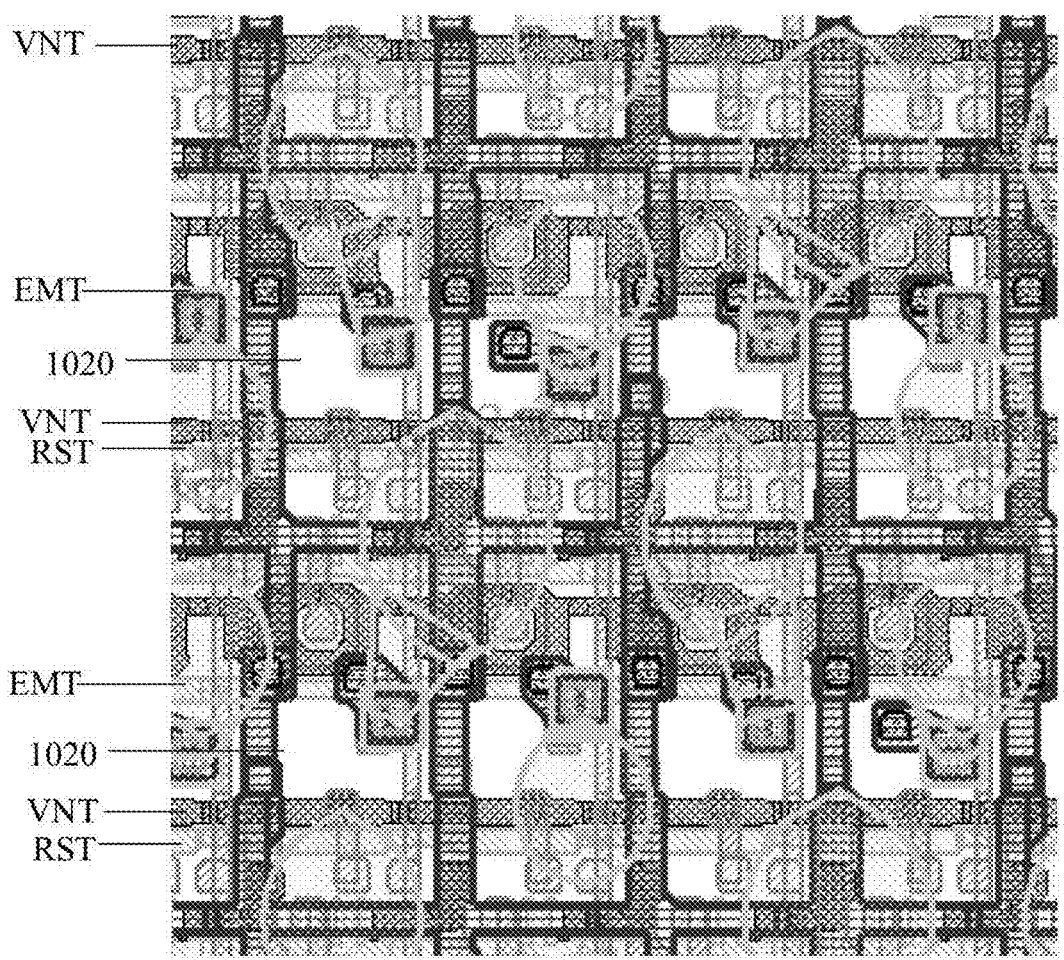

FIG. 18A shows a schematic diagram of a first electrode material layer of the display substrate, and the first electrode material layer is provided on the passivation layer 109. FIG. 18B shows a schematic diagram of a stacked layer, in which the first electrode material layer, the second source-drain metal layer, the first source-drain metal layer, the second gate metal layer, the first gate metal layer, and the semiconductor layer are stacked, of the display substrate.

As shown in FIG. 18A and FIG. 18B, the first electrode material layer includes the first electrode layers of the light-emitting devices EM of the plurality of sub-pixels, and the first electrode layers of the light-emitting devices EM of the plurality of sub-pixels are connected to the connection electrode 1043 through the plurality of vias VA in the planarization layers 109, respectively. For example, a light-emitting material layer of the light-emitting device EM is provided on the first electrode layer, and a second electrode layer is provided on the light-emitting material layer.

For example, other functional layers such as an encapsulation layer, a black matrix layer, a protective cover plate 115 and the like are further formed above the light-emitting device EM, which will not be repeated here.

For example, in the embodiments of the present disclosure, the base substrate 101 includes a flexible insulating material such as polyimide (PI) or a rigid insulating material such as a glass substrate. For example, in some examples, the base substrate 101 is a stacked structure in which a plurality of flexible layers and a plurality of barrier layers are alternately arranged. In this case, the flexible layer may include polyimide, and the barrier layer may include an inorganic insulating material such as silicon oxide, silicon nitride, silicon oxynitride, or the like. For example, the buffer layer 103 may include an inorganic material such as silicon nitride, silicon oxide, silicon oxynitride, or the like. The active layer 1021 is made of a material such as polysilicon, metal oxide, or the like, and the first gate insulating layer 1024 and the second gate insulating layer 1025 are made of an inorganic insulating material such as silicon oxide, silicon nitride, silicon oxynitride, or the like. The gate electrode 1022 and the first capacitor electrode C1 are made of a metal material such as copper, aluminum, titanium, cobalt, or the like, for example, they are formed into a single-layer structure or a multi-layer structure, for example a multi-layer structure such as titanium/aluminum/titanium, molybdenum/aluminum/molybdenum, or the like. The second capacitor electrode C2 is made of a metal material such as copper, aluminum, titanium, cobalt, or the like, or an alloy material; the interlayer insulating layer 1026 is made of an inorganic insulating material such as silicon oxide, silicon nitride, silicon oxynitride, or the like; and the passivation layer 1027 is made of an inorganic insulating material such as silicon oxide, silicon nitride, silicon oxynitride, or the like. The source and drain electrodes 1023 and 1024 are made of a metal material such as copper, aluminum, titanium, cobalt, or the like, for example, are formed into a single-layer structure or a multi-layer structure, for example a multi-layer structure such as titanium/aluminum/titanium, molybdenum/aluminum/molybdenum, or the like. The first electrode layer 104 is, for example, an anode layer, including a metal oxide such as ITO, IZO, or the like, or a metal such as Ag, Al, Mo, or the like, or their alloys. The material of the light-emitting material layer 105 is an organic light-emitting material. For example, the material of the light-emitting material layer 105 is selected as a light-emitting material that can emit light of a certain color (e.g., red light, blue light, or green light, etc.) according to requirements. The second electrode layer 106 is, for example, a cathode layer, including a metal such as Mg, Ca, Li, Al, or the like, or their alloys, or a metal oxide such as IZO, ZTO, or the like, or an organic material with conductive properties such as PEDOT/PSS (poly3, 4-ethylenedioxythiophene/polystyrene sulfonate), or the like. The planarization layer 109 (and the planarization layer 1091), the pixel definition layer 108, and the spacer 107 are made of an organic insulating material such as polyimide or the like. The protective cover plate 115 may be a transparent cover plate such as a glass cover plate or the like. The embodiments of the present disclosure do not specifically limit the materials of each functional layer.

For example, in the embodiments of the present disclosure, the first conductive layer M1 and the second conductive layer M2 of the touch control structure are metal layers or transparent conductive layers, and the materials include a metal material such as copper, aluminum, or the like, or a transparent metal oxide such as ITO, IZO, or the like. The substrate B includes an inorganic insulating material such as silicon oxide, silicon nitride, silicon oxynitride, or the like, or an organic insulating material such as polyimide, or the like. The spacer insulating layer I may also include an inorganic insulating material such as silicon oxide, silicon nitride, silicon oxynitride, or the like, or an organic insulating material such as polyimide, or the like. For example, as shown in FIG. 6, the second conductive layer M2 of the touch control structure is further covered with a protective insulating layer P, and the protective insulating layer P may also include an inorganic insulating material such as silicon oxide, silicon nitride, silicon oxynitride, or the like, or an organic insulating material such as polyimide, or the like, so as to protect the second conductive layer M2. The embodiments of the present disclosure do not specifically limit other structures and materials of the touch control structure.

Figure 19:
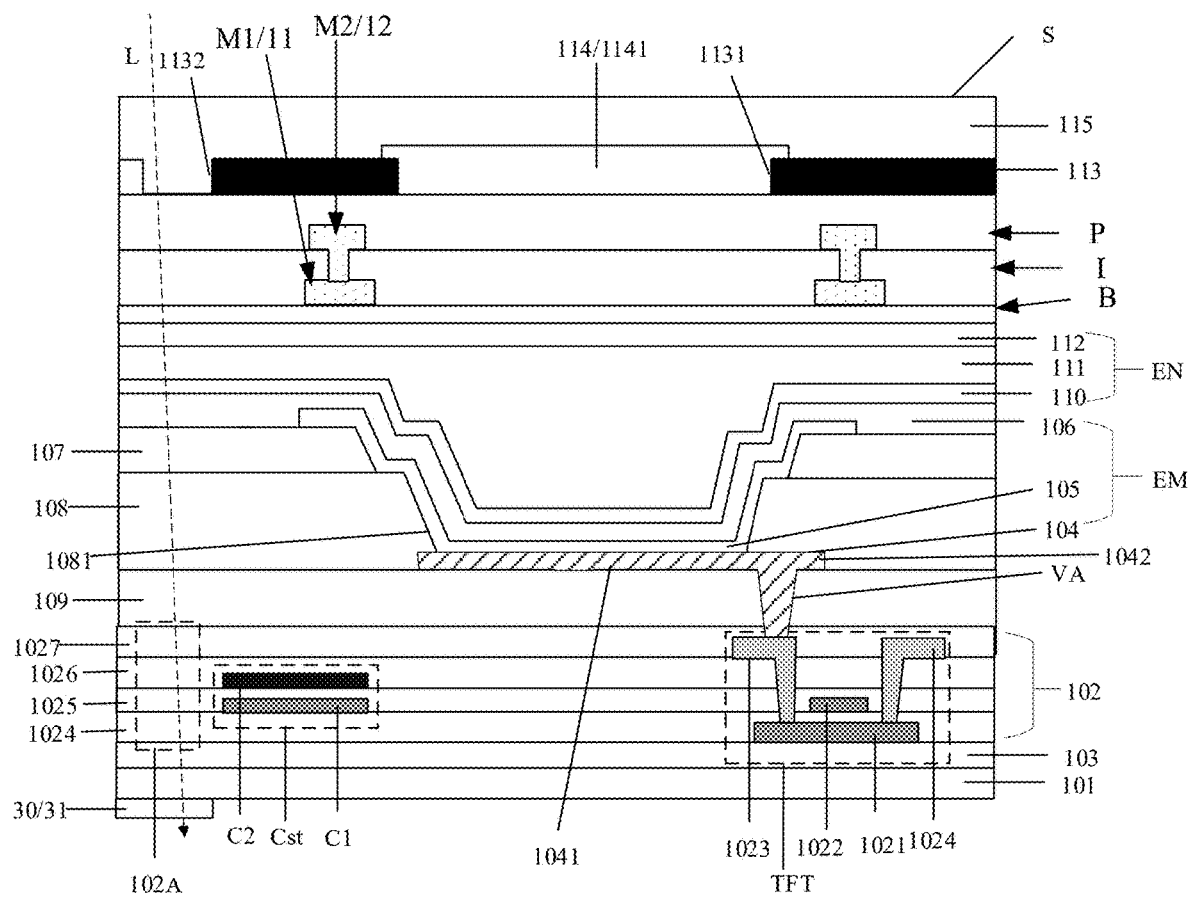
FIG. 19 is a schematic cross-sectional view of a display device provided by at least one embodiment of the present disclosure.

At least one embodiment of the present disclosure further provides a display device, and FIG. 19 shows a schematic cross-sectional view of the display device. As shown in FIG. 19, the display device includes the display substrate provided by the embodiments of the present disclosure, and the display substrate shown in FIG. 6 is shown in FIG. 19 as an example.

For example, in some embodiments, the display device further includes a texture touch surface S and an image sensor array 30, for example, the surface of the protective cover plate 115 is implemented as the texture touch surface S. The image sensor array is provided on the side of the driving circuit layer 102 away from the light-emitting device layer, and includes a plurality of image sensors 31 (one image sensor is shown as an example in the figure), and the plurality of image sensors 31 are configured to receive light, which is emitted from the plurality of light-emitting devices EM in the light-emitting device layer, reflected by a texture (e.g., a fingerprint, a palm print, etc.) on the texture touch surface S, and reaching the plurality of image sensors 31 through the plurality of second light-transmitting openings 1132, for texture collection.

For example, referring to FIG. 19, the pixel driving circuit of the driving circuit layer includes a plurality of light-transmitting portions 102A, and one second light-transmitting opening 1132 corresponds to one light-transmitting portion 102A. In this case, the plurality of image sensors 31 are configured to receive light, which is emitted from the plurality of light-emitting devices EM in the light-emitting device layer, reflected by the texture on the textured touch surface S, and reaching the plurality of image sensors 31 through the plurality of second light-transmitting openings 1132 of the black matrix layer 113 and the plurality of light-transmitting portions of the driving circuit layer, for texture collection. Thus, the plurality of image sensors 31 can sufficiently receive the light reflected by the texture through the plurality of second light-transmitting openings 1132 and the plurality of light-transmitting portions 102A, thereby increasing the speed of texture recognition and the accuracy of texture recognition.

The following statements should be noted:

(1) The drawings of the embodiment(s) of the present disclosure involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, having a plurality of sub-pixels arranged in an array, and comprising a base substrate, a driving circuit layer on the base substrate, a light-emitting device layer on a side of the driving circuit layer away from the base substrate, and a black matrix layer on a side of the light-emitting device layer away from the base substrate, wherein each of the plurality of sub-pixels comprises a pixel driving circuit in the driving circuit layer and a light-emitting device in the light-emitting device layer, the pixel driving circuit is configured to drive the light-emitting device, the black matrix layer comprises a plurality of first light-transmitting openings respectively exposing light-emitting devices of the plurality of sub-pixels in a direction perpendicular to a surface of the base substrate, and a plurality of second light-transmitting openings respectively between the plurality of first light-transmitting openings; and the driving circuit layer comprises a plurality of light-transmitting portions, and each of the plurality of second light-transmitting openings is provided corresponding to at least one of the plurality of light-transmitting portions for transmitting light in a predetermined angle range with the surface of the display substrate;

the plurality of sub-pixels comprise a first sub-pixel and a second sub-pixel, and the plurality of light-transmitting portions comprise a first light-transmitting portion comprised in a pixel driving circuit of the first sub-pixel and a second light-transmitting portion comprised in a pixel driving circuit of the second sub-pixel;

in the direction perpendicular to the surface of the base substrate, the plurality of second light-transmitting openings comprise a first light-transmitting sub-opening at least partially overlapping with the first light-transmitting portion and a second light-transmitting sub-opening at least partially overlapping with the second light-transmitting portion; and in a direction parallel to the surface of the base substrate, a plane shape of the first light-transmitting sub-opening is different from a plane shape of the second light-transmitting sub-opening;

a ratio of an area of the first light-transmitting sub-opening to an area of the second light-transmitting sub-opening is greater than or equal to 2.

2. The display substrate according to claim 1, wherein the plurality of sub-pixels further comprise a third sub-pixel, a pixel driving circuit of the third sub-pixel has a third light-transmitting portion, and in the direction perpendicular to the surface of the base substrate, the plurality of second light-transmitting openings further comprise a third light-transmitting sub-opening at least partially overlapping with the third light-transmitting portion; and in the direction parallel to the surface of the base substrate, a plane shape of the third light-transmitting sub-opening is different from the plane shape of the first light-transmitting sub-opening and the plane shape of the second light-transmitting sub-opening, and an area of the third light-transmitting sub-opening is larger than the area of the second light-transmitting sub-opening, and is substantially equal to the area of the first light-transmitting sub-opening.

3. The display substrate according to claim 2, wherein the plurality of sub-pixels further comprise a fourth sub-pixel, a pixel driving circuit of the fourth sub-pixel has a fourth light-transmitting portion, and in the direction perpendicular to the surface of the base substrate, the plurality of second light-transmitting openings further comprise a fourth light-transmitting sub-opening at least partially overlapping with the fourth light-transmitting portion; and in the direction parallel to the surface of the base substrate, a plane shape of the fourth light-transmitting sub-opening is different from the plane shape of the first light-transmitting sub-opening, the plane shape of the second light-transmitting sub-opening, and the plane shape of the third light-transmitting sub-opening, and an area of the fourth light-transmitting sub-opening is smaller than the area of the third light-transmitting sub-opening and the area of the first light-transmitting sub-opening, respectively, and is larger than the area of the second light-transmitting sub-opening.

4. The display substrate according to claim 3, wherein a ratio of the area of the first light-transmitting sub-opening, the area of the second light-transmitting sub-opening, the area of the third light-transmitting sub-opening, and the area of the fourth light-transmitting sub-opening is in a range of (3~4):1:(3~4):(2.5~3.5).

5. The display substrate according to claim 3, wherein the first sub-pixel is a red sub-pixel, the second sub-pixel is a green sub-pixel, the third sub-pixel is a blue sub-pixel, and the fourth sub-pixel is a green sub-pixel; and one first sub-pixel, one second sub-pixel, one third sub-pixel, and one fourth sub-pixel are configured as a repeating unit, and a plurality of repeating units are arranged in an array on the base substrate.

6. The display substrate according to claim 5, further comprising a color film layer, wherein the color film layer comprises a plurality of color film patterns respectively covering the plurality of first light-transmitting openings;

in the direction perpendicular to the surface of the base substrate, the plurality of color film patterns comprise a first color film pattern at least partially overlapping with a light-emitting device of the first sub-pixel and a second color film pattern at least partially overlapping with a light-emitting device of the second sub-pixel; and in the direction parallel to the surface of the base substrate, a plane shape of the first color film pattern is different from a plane shape of the second color film pattern, and an area of the first color film pattern is larger than an area of the second color film pattern.

7. The display substrate according to claim 6, wherein the first color film pattern is substantially rectangular, and the second color film pattern is substantially semi-elliptical.

8. The display substrate according to claim 6, wherein the plurality of color film patterns further comprise a third color film pattern at least partially overlapping with a light-emitting device of the third sub-pixel; and in the direction parallel to the surface of the base substrate, a plane shape of the third color film pattern is different from the plane shape of the first color film pattern and the plane shape of the second color film pattern, and an area of the third color film pattern is larger than the area of the first color film pattern and the area of the second color film pattern, respectively.

9. The display substrate according to claim 8, wherein a ratio of the area of the first color film pattern, the area of the second color film pattern, and the area of the third color film pattern is in a range of (1~1.5):1:(1~1.6).

10. The display substrate according to claim 8, wherein in the direction perpendicular to the surface of the base substrate, the plurality of color film patterns further comprise a fourth color film pattern at least partially overlapping with a light-emitting device of the fourth sub-pixel; and in the direction parallel to the surface of the base substrate, a plane shape of the fourth color film pattern is substantially same as the plane shape of the second color film pattern, and an area of the fourth color film pattern is substantially equal to the area of the second color film pattern;

in the direction perpendicular to the surface of the base substrate, the fourth color film pattern partially overlaps with the fourth light-transmitting sub-opening.

11. The display substrate according to claim 6, wherein a minimum distance between edges of the plurality of color film patterns and edges of the plurality of second light-transmitting openings ranges from 1 μm to 5 μm.

12. The display substrate according to claim 6, further comprising a planarization layer on the side of the driving circuit layer away from the base substrate and a pixel definition layer on a side of the planarization layer away from the base substrate, wherein the pixel definition layer comprises a plurality of sub-pixel openings;

the light-emitting device comprises a first electrode layer, a light-emitting material layer and a second electrode layer that are sequentially stacked in a direction away from the base substrate, the first electrode layer is on the side of the planarization layer away from the base substrate, the pixel definition layer is on a side of the first electrode layer away from the base substrate, and the plurality of sub-pixel openings respectively expose first electrode layers of the light-emitting devices of the plurality of sub-pixels; and for one first light-transmitting opening and one sub-pixel opening corresponding to a same sub-pixel, a plane shape of the one first light-transmitting opening is substantially same as a plane shape of the one sub-pixel opening.

13. The display substrate according to claim 12, wherein for one color film pattern and one sub-pixel opening corresponding to a same sub-pixel, a plane shape of the one color film pattern is different from a plane shape of the one sub-pixel opening.

14. The display substrate according to claim 12, wherein the first electrode layer comprises a main body portion and a connection portion, the connection portion is configured to be electrically connected to the pixel driving circuit, and the orthographic projection of the sub-pixel opening on the base substrate is located inside an orthographic projection of the main body portion on the base substrate;

the display substrate further comprises a plurality of connection electrodes on a side of the planarization layer close to the base substrate, wherein first electrode layers of the light-emitting devices of the plurality of sub-pixels are respectively electrically connected to the plurality of connection electrodes through a plurality of vias in the planarization layer, and the plurality of connection electrodes are electrically connected to pixel driving circuits of the plurality of sub-pixels, and in the direction perpendicular to the surface of the base substrate, the connection electrode at least partially overlaps with the connection portion of the first electrode layer.

15. The display substrate according to claim 14, further comprising a touch control structure between the light-emitting device layer and the black matrix layer, wherein the touch control structure at least partially overlaps with connection portions of the first electrode layers of the light-emitting devices in at least part of the plurality of sub-pixels.

16. The display substrate according to claim 15, wherein the touch control structure comprises a first conductive layer, and the first conductive layer comprises a first pattern formed by a plurality of first lines; and in the direction perpendicular to the surface of the base substrate, the first pattern at least partially overlaps with connection portions of the first electrode layers of the light-emitting devices of the first sub-pixel and the third sub-pixel.

17. The display substrate according to claim 16, wherein the touch control structure further comprises a second conductive layer on a side of the first conductive layer away from the base substrate, the second conductive layer comprises a second pattern formed by a plurality of second lines, and in the direction perpendicular to the surface of the base substrate, the second pattern at least partially overlaps with connection portions of the first electrode layers of the light-emitting devices of the first sub-pixel, the second sub-pixel, and the third sub-pixel.

18. A display device, comprising the display substrate according to claim 1.

* * * * *